United States Patent [19]

Raymond et al.

[11] Patent Number: 5,682,392
[45] Date of Patent: Oct. 28, 1997

[54] METHOD AND APPARATUS FOR THE AUTOMATIC GENERATION OF BOUNDARY SCAN DESCRIPTION LANGUAGE FILES

[75] Inventors: Douglas W. Raymond, Orinda, Calif.; D. Eugene Wedge, Norwell, Mass.; Philip J. Stringer, Otter Shaw, England

[73] Assignee: Teradyne, Inc., Boston, Mass.

[21] Appl. No.: 699,219

[22] Filed: Aug. 19, 1996

Related U.S. Application Data

[63] Continuation of Ser. No. 314,602, Sep. 28, 1994, abandoned.
[51] Int. Cl.$^6$ .................................................. G01R 31/28
[52] U.S. Cl. ................................. 371/22.3; 395/183.06
[58] Field of Search ...................... 395/183.06; 371/22.3

[56] References Cited

U.S. PATENT DOCUMENTS

| | | | |
|---|---|---|---|
| 4,066,882 | 1/1978 | Esposito | 324/73.1 |
| 4,176,780 | 12/1979 | Sachor et al. | 371/27 |
| 4,433,414 | 2/1984 | Carey | 371/27 |
| 4,456,840 | 6/1984 | Russell | 324/73.1 |
| 4,534,028 | 8/1985 | Trischler | 324/73.1 |
| 4,646,299 | 2/1987 | Schinabeck | 364/579 |
| 4,672,307 | 6/1987 | Breuer | 371/27 |
| 4,688,223 | 8/1987 | Motika et al. | 371/27 |
| 4,907,230 | 3/1990 | Heller et al. | 371/22.1 |
| 5,004,978 | 4/1991 | Morris, Jr. et al. | 324/158 R |
| 5,079,725 | 1/1992 | Geer et al. | 364/550 |
| 5,111,459 | 5/1992 | DeVigne | 371/27 |
| 5,185,745 | 2/1993 | Manca, Jr. | 371/22.3 |
| 5,258,986 | 11/1993 | Zorbe | 371/27 |
| 5,260,947 | 11/1993 | Posse | 371/22.3 |
| 5,297,151 | 3/1994 | Gruetzner et al. | 371/27 |
| 5,325,368 | 6/1994 | James et al. | 371/22.3 |
| 5,333,139 | 7/1994 | Sturges | 371/22.3 |
| 5,343,478 | 8/1994 | James et al. | 371/22.3 |

FOREIGN PATENT DOCUMENTS

| | | |
|---|---|---|
| 0342787A2 | 4/1989 | European Pat. Off. |
| 2266965 | 11/1993 | United Kingdom |

OTHER PUBLICATIONS

Giraldi & Bushnell, "EST: The New Frontier in Automatic Test-Pattern Generation", *IEEE*, 667–672, 1990.

Manual History, "Z1800–Series Programmer's Guidebook," *Special and Advanced Applications*, 7–35–7–73, 1992.

Wirbel, "Startup claims ASIC test coup", *Electronic Engineering Times*, Issue 588, Apr. 30, 1990.

(List continued on next page.)

*Primary Examiner*—Robert W. Beausoliel, Jr.
*Assistant Examiner*—Phillip F. Vales
*Attorney, Agent, or Firm*—Richard E. Gamache

[57] ABSTRACT

A method and apparatus is presented for the automatic generation of boundary scan description language files for integrated circuits incorporating boundary scan circuitry of indeterminate configuration. The user enters basic pin information for the integrated circuit under consideration, along with an identification of which pins are the boundary-scan TAP pins and which are the power and ground pins. The user connects the pins of a sample integrated circuit to the test channels of the apparatus of the invention. The apparatus of the present invention operates in accordance with the method of the present invention automatically to determine: (1) the length of the instruction register; (2) the length of the boundary scan data register; (3) which pins of the integrated circuit are outputs and which pins are inputs, and which are I/O or tri-state outputs; (4) the order that the pins are represented in the boundary scan data register; (5) the identity of the control cells in the boundary scan data register that control I/O and tri-state pins, along with which pins each controls and the sign of the control; (6) the identity of the SAMPLE/PRELOAD instruction; and (7) the identity of the IDCODE instruction and ID code, if present. These parameters are expressed in standard language in a boundary-scan description language file for the integrated circuit under investigation, thus facilitating the use of known automatic program generation software to create test programs.

11 Claims, 19 Drawing Sheets

OTHER PUBLICATIONS

Cosley, "Strategies and tools for generating test vectors differ for design and production test," *Personal Engineering & Instrumentation News*, 53–58, Aug. 1990.

Jack Shandle, "Testing ICs to the Max," *Electronics*, 39–40, May 1990.

M.D. Durand, "Accuracy vs. Speed in Placement," *IEEE Design and Test of Computers*, 8–34, Jun. 1989.

Saluja and Kim, "Improved Test Generation for High–Activity Circuits", *IEEE Design and Test of Computers*, 26–31, Aug. 1990.

Bassett, et al., "Low–Cost Testing of High–Density Logic Components", *IEEE Design and Test of Computers*, 15–28, Apr. 1990.

Abramovici, et al., "Digital Systems Testing and Testable Design", *Computer Science Press*, 181–342.

Chen, et al., "Checkpoints in Irredundant Two–Level Combinational Circuits", *Journal of Electronic Testing*: Theory and Applications, 2:395–397, 1991.

Chatterjee and Abraham, "Test Generation, Design–for–Testability and Built–In Self–Test for Arithmetic Units Based on Graph Labeling", *Journal of Electronic Testing: Theory and Applications*, 2:351–372, 1991.

Markowsky, "Bounding Fault Detection Probabilities in Combinational Circuits", *Journal of Electronic Testing: Theory and Applications*, 2:315–323, 1991.

Reppen and Aas, "Combined Probalistic Testability Calculations and Compact Test Generation for PLAs", *Journal of Electronic Testing: Theory and Applications*, 2:215–227, 1991.

Giraldi and Bushnell, "Search State Equivalence for Redudancy Identification and Test Generation", *IEEE*, International Test Conference, 1991.

Saab, et al., "CRIS: A Test Cultivation Program for Sequential VLSI Circuits," 1992 *IEEE/ACM International Conference on Computer–Aided Design*, Santa Clara, Ca. pp. 216–219.

"Supplement (B) to Standard Test Access Port and Boundary–Scan Architecture", *IEEE Publication p1149.1b/D10*, Jul. 6, 1994.

"Introduction to Boundary–Scan Description Language (BSDL)", *IEEE*.

| BS CELL POSITION | PATTERN 0 | 1 | 2 | 3 | 4 |
|---|---|---|---|---|---|
| 1 | 1 | 0 | 0 | 0 | 0 |
| 2 | 0 | 1 | 0 | 0 | 0 |
| 3 | 1 | 1 | 0 | 0 | 0 |
| 4 | 0 | 0 | 1 | 0 | 0 |
| 5 | 1 | 0 | 1 | 0 | 0 |
| 6 | 0 | 1 | 1 | 0 | 0 |
| 7 | 1 | 1 | 1 | 0 | 0 |
| 8 | 0 | 0 | 0 | 1 | 0 |
| 9 | 1 | 0 | 0 | 1 | 0 |
| 10 | 0 | 1 | 0 | 1 | 0 |
| 11 | 1 | 1 | 0 | 1 | 0 |
| 12 | 0 | 0 | 1 | 1 | 0 |
| 13 | 1 | 0 | 1 | 1 | 0 |
| 14 | 0 | 1 | 1 | 1 | 0 |
| 15 | 1 | 1 | 1 | 1 | 0 |
| 16 | 0 | 0 | 0 | 0 | 1 |
| 17 | 1 | 0 | 0 | 0 | 1 |
| 18 | 0 | 1 | 0 | 0 | 1 |
| 19 | 1 | 1 | 0 | 0 | 1 |
| 20 | 0 | 0 | 1 | 0 | 1 |
| 21 | 1 | 0 | 1 | 0 | 1 |
| 22 | 0 | 1 | 1 | 0 | 1 |
| 23 | 1 | 1 | 1 | 0 | 1 |
| 24 | 0 | 0 | 0 | 1 | 1 |
| 25 | 1 | 0 | 0 | 1 | 1 |
| 26 | 0 | 1 | 0 | 1 | 1 |
| 27 | 1 | 1 | 0 | 1 | 1 |
| 28 | 0 | 0 | 1 | 1 | 1 |
| 29 | 1 | 0 | 1 | 1 | 1 |
| 30 | 0 | 1 | 1 | 1 | 1 |

FIG.7B

| DEVICE PIN NUMBER | PATTERN → | | | | | |
| --- | --- | --- | --- | --- | --- | --- |
| | 0 | 1 | 2 | 3 | 4 | |
| 1 | 1 | 0 | 0 | 0 | 0 | |
| 2 | 0 | 1 | 0 | 0 | 0 | |
| 3 | 1 | 1 | 0 | 0 | 0 | |
| 4 | 0 | 0 | 1 | 0 | 0 | |
| 5 | 1 | 0 | 1 | 0 | 0 | |
| 6 | X | X | X | X | X | GROUND PIN |
| 7 | 1 | 1 | 1 | 0 | 0 | |
| 8 | 0 | 0 | 0 | 1 | 0 | |
| 9 | 1 | 0 | 0 | 1 | 0 | |
| 10 | 0 | 1 | 0 | 1 | 0 | |
| 11 | X | X | X | X | X | TDO |
| 12 | X | X | X | X | X | TMS |
| 13 | X | X | X | X | X | TCK |
| 14 | X | X | X | X | X | TDI |
| 15 | 1 | 1 | 1 | 1 | 0 | |
| 16 | 0 | 0 | 0 | 0 | 1 | |
| 17 | X | X | X | X | X | OUTPUT PIN |
| 18 | X | X | X | X | X | Vcc PIN |
| 19 | X | X | X | X | X | OUTPUT PIN |
| 20 | X | X | X | X | X | OUTPUT PIN |
| 21 | X | X | X | X | X | OUTPUT PIN |
| 22 | 0 | 1 | 1 | 0 | 1 | |
| 23 | 1 | 1 | 1 | 0 | 1 | |
| 24 | 0 | 0 | 0 | 1 | 1 | |

FIG. 10B

METHOD AND APPARATUS FOR THE AUTOMATIC GENERATION OF BOUNDARY SCAN DESCRIPTION LANGUAGE FILES

This is a continuation of Ser. No. 08/314,602, filed Sep. 28, 1994, now abandoned.

BACKGROUND OF THE INVENTION

The present invention relates to a method and apparatus for the automatic generation of Boundary Scan Description Language ("BSDL") files. BSDL files are commonly used in the preparation of test programs for electronic devices having boundary-scan test capability. Boundary scan and BSDL are known in the art of automatic test, and are the subjects of standards issued by the Institute of Electrical and Electronic Engineers ("IEEE").

Assembly of electronic circuit boards is an error-prone process. Hundreds, or even thousands, of components may need to be placed on a circuit board during the assembly process. Any of these may accidentally be omitted, damaged, or misoriented. One or more pins (note: "pins" are sometimes called "leads") of a component having a large number of pins may not get properly bonded to its matching conductive pads on the circuit board, resulting in an open circuit. Such faults are very difficult to find by visual inspection. Because of this, automatic test equipment ("ATE") is incorporated into an assembly line at a point after the components are placed on the circuit boards and their pins bonded to the conductive traces. ATE must ascertain that the completed assembly has all of its right components and that each component's pins are all correctly bonded to the right conductive traces on the circuit board.

By inspecting each newly assembled board for correct assembly, the ATE stops incorrectly assembled products from going farther into the manufacturing process. It diagnoses the incorrectly assembled component so the product may be expeditiously reworked. It also provides important process-control information to allow the people who operate the assembly line to make corrections if necessary.

Conventional in-circuit ATE, as is known in the art, performs many different kinds of tests in order to verify the presence of different kinds of components. The present invention is related to ATE that tests boards containing digital integrated circuits (IC's). Conventionally, such an ATE inspects each digital IC by applying stimuli to circuit nodes that are supposed to be bonded to input pins of the IC, while monitoring responses from circuit nodes that are supposed to be bonded to the IC's output pins. This method of testing newly assembled circuit boards is known in the art as "in-circuit testing."

The pattern of input stimuli in each digital IC test is designed by a test engineer to reveal "pin faults," i.e. pins that appear not to be properly connected to their intended conductive traces. If an input pin is not connected, for example, the component will not receive the full stimulus pattern that the ATE produces, so it will not go through its full intended exercise, and thus it will produce output signals different from those expected. Likewise, if an output pin is not connected, the ATE will stimulate the IC in question but the tester will not receive the full expected output sequence. In either case, the ATE can tell whether or not the IC is of the right type, and can also tell if all of its pins are correctly bonded. An incorrect, misoriented or nonfunctioning IC will respond incorrectly and be indicted by the ATE.

Three Problems for ATE

Each new kind of digital IC requires a new kind of test pattern. Creation of test patterns for new digital IC's requires a high degree of skill and experience. As time goes by, it has become more and more expensive to design test patterns for new digital IC's, for three main reasons. First, today's new IC's are more complicated than yesterday's, so they need more complicated test patterns. Second, today's new IC's have a greater number of pins than yesterday's, so a larger number of faults must be considered, which additionally complicates the test patterns. Third, today's circuit board and device-pin geometries are finer than yesterday's, so it becomes ever more expensive to make test fixtures that allow the ATE to make contact with all of the circuit nodes.

Boundary Scan

Addressing all three of these problems is a technique called "boundary scan." In boundary scan, each IC is designed to include not only the logic circuits to carry out its intended mission, but also to those needed to create a Test Access Port ("TAP") and some shift registers specifically dedicated to test functions. These features simplify test pattern preparation for the new IC, and also make it possible for ATE to test some kinds of circuit boards without requiring access to all of the circuit's electrical nodes.

Boundary scan discipline is governed by a standard that is published and maintained by the IEEE. IEEE Standard 1149.1, which defines the "IEEE Standard Test Access Port and Boundary Scan Architecture," is expressly incorporated herein by reference. It will be referred to in the following discussion as "the 1149.1 standard" or simply as "the standard."

In the boundary scan discipline, each IC package is equipped with four, or optionally five, additional pins. The mandatory four added pins are called TDI, TDO, TMS and TCK. The fifth, optional pin is called TRST*. The internal silicon is equipped with a TAP controller, that is controlled by the added TMS (test mode select) and TCK (Test clock) pins, and is equipped with some shift registers. The TAP controller is a state machine having sixteen states, and is well explained in the 1149.1 standard. TDI (test data input) and TDO (test data output) access the input and output ends of the shift register selected by the current instruction. TRST* (TAP reset—not), if provided, resets the TAP.

By applying a specified set of instructions and other signals to the TAP pins, the ATE can divert the IC from its normal operations and make it behave instead as a simple shift register with one stage (or "cell") per component pin. Additional "control" cells are optionally included for other purposes, e.g. for enabling and disabling three-state output stages on associated output cells or associated groups of output cells.

FIG. 1 partially illustrates an IC having boundary scan cells 11. Note that cells shown are typical, and that the 1149.1 standard permits several different kinds of cells. A given IC may have cells of a design differing from that shown here: the present invention will work on any IC that complies with the 1149.1 standard, regardless of specific details of its cell design. These cells are shown for the purpose of explaining the operation of boundary scan, to help the reader understand the purposes and workings of the present invention.

The IC's normal logic 12 is shown in FIG. 1 as an ellipse at the center. Input signals 16 to the normal logic 12 enter at the left, and outputs 17 exit at the right. Each of the two illustrated boundary scan cells 11 is a member of the IC's boundary scan data register, and each includes two multiplexers 18 and two edge-triggered flipflops 19.

The group of signals, 13 (ShiftDR, ClockDR, UpdateDR and Mode), is produced by the TAP controller under instructions from the ATE. The Shift Out (SO) output of one cell is connected to the Shift In (SI) input of the next cell, or to the TAP's TDO output selector 23 if the cell is the last cell in the boundary scan data register. The SI input of one cell is connected to the SO output of the previous cell, or to the TAP's TDI input if the cell is the first cell in the boundary scan data register.

FIG. 2, like FIG. 1, shows the normal logic 12 as an ellipse in the center of the IC, surrounded by boundary scan cells 11 which are connected to one another to form a boundary scan data register. The IC also contains some other shift registers associated with boundary scan operations, one of which is the instruction register 21, and one of which is the bypass register 22. For any given IC design, the bypass register is fixed by the 1149.1 standard to be always one cell long. The instruction register in a given IC, however, may be of any length, as may the boundary scan data register. There may also be other optional data registers. The present invention is concerned as a minimum with the instruction register, the bypass data register, boundary scan data register and the device identification data register. The latter three are all in the category of "data register" (as opposed to "instruction register," of which there is only one) so are often referred to simply as the "bypass register," the "boundary scan register" or "BS register" and the "IDCODE register."

All registers are controlled by the TAP controller 23. Their serial inputs all originate with the TDI pin 24. The TAP controller, responding to an instruction in the instruction register, selects one data register, whose cells will receive clocks and whose output will be conducted out the TDO pin 29. Data registers which are not selected are not clocked.

The TAP controller responds to instructions provided by the ATE at test time. The ATE controls the state of the TAP state machine by raising and lowering the TMS signal 26 in association with pulses on the TCK clock 27. The TRST signal 28, which resets the TAP controller to a known state, is optional: the ATE may also use an instruction to reset the TAP controller.

The TAP controller, acting on TMS sequences supplied by the ATE, manipulates the control signals to the cells of the various registers to cause several kinds of actions. Some of the actions of concern include: entering a TMS sequence to allow the instruction-register to be shifted and updated; entering an instruction to select a data register; capturing the state of the boundary scan input pins 16; controlling the state of the boundary scan output pins 17; and shifting the selected data register. ATE shifts the boundary scan data register for two main purposes: first, to move information to cells on output pins, in order subsequently to set those pins to their high or low states; second, to move information representing captured states of input pins via the TDO output 29 into the ATE for examination. It should be noted that FIG. 2 is not a fully generalized example: and additional detail may be found in the 1149.1 standard.

Boundary Scan Solves the Three Problems

ATE test patterns for shift registers are considerably simpler than ATE test patterns for complex logic devices. Shift registers are straightforward and present no mysteries. By simply adding the TAP controller and shift registers, therefore, boundary scan removes the first two of the three problems mentioned earlier: ever-growing complexity, and ever-growing pin count. If an IC contains boundary scan circuitry, the test engineer is no longer concerned about how complicated the IC's ultimate function is: the ATE will see the IC only as a simple shift register. And shift registers with 400 pins are not much harder to program than shift registers with 40 pins—the patterns are longer, but of no greater complexity.

Boundary scan also relieves the third problem—growing lack of access between the ATE and the circuit board nodes—by making it possible for the ATE to use the outputs of one IC's boundary scan register to stimulate the inputs of another IC's boundary scan register. By the same token, the ATE can use the inputs of one IC's boundary scan register to sample the outputs of another IC's boundary scan register. If the result of the sampling operation is not as expected, the ATE can report that there is a problem in the interconnecting circuit board wiring between the two IC's.

The details of the stimulating and sampling arrangements are dictated by the specifics of the interconnection paths on the circuit board. The programming for this kind of test, which involves coordinated actions of several IC's, is more complex than the programming of tests for single IC's where the ATE has full access to all circuit nodes. Nonetheless, it does allow the testing of electrical nodes that interconnect pins of boundary scan-equipped IC's without demanding direct access from those nodes to the ATE's test channels.

BSDL

Aiding the engineer in the handling of the solutions to all these three problem areas is the standardized discipline of boundary scan. That boundary scan has a dependable discipline means that IC's can have their boundary scan features described unambiguously in a simple language such as BSDL. Like boundary scan itself, BSDL is the subject of an IEEE standard. At the time of this writing, the BSDL standard is in draft form, and is known as IEEE-STD-P1149.1B/D10. That document, referred to herein as the "BSDL standard" to contrast it with "the standard" or "the 1149.1 standard", is also expressly incorporated herein by reference.

The standardization of boundary scan and BSDL has made possible the development of automatic test program generation software. One such software system is VICTORY, made by Teradyne, Inc., 321 Harrison Avenue, Boston Mass. 02118, the assignee of the present invention. Such software systems greatly ease the test engineer's burden, by fully automating the composition of test patterns for boards containing boundary scan IC's.

Automatic test program generation software for boundary scan tests must be given information about the boundary scan implementations in the individual IC's on the board under test, and also information about the interconnections among IC pins in an assembled board. Additionally, the software needs information about the wiring in the test fixture that is used to connect nodes of the circuit under test to the ATE's test channels during test. ATE machines and their test languages vary considerably from one kind of ATE to the next, so the formats for expressing circuit board interconnections and fixture wiring are not standardized. The language for expressing boundary scan implementation is standardized, however, and as noted earlier in this discussion, is called "BSDL."

BSDL, like most other languages designed for machines to read, allows certain kinds of statements, each statement carrying a particular kind of information to the machine reading it. The following lines constitute a BSDL file for a simple IC known as a "74bct8244."

--- entity tt174bct8244 is
  generic (PHYSICAL_PIN_MAP : string := "UNDEFINED");
  port (G1:in bit;
    Y1:out bit_vector(1 to 4);
    Y2:out bit_vector(1 to 4);
    A1:in bit_vector(1 to 4);

-continued

```
    A2:in bit_vector(1 to 4);
    G2:in bit;
    GND, VCC:linkage bit;
    TDO:out bit;
    TDI, TMS, TCK:in bit);
use STD_1149_1_1990.all; -- Get standard things
attribute PIN_MAP of tt174bct8244 : entry is
    PHYSICAL_PIN_MAP;
constant JT_PACKAGE : PIN_MAP_STRING := ""&
    "G1:1, "&
    "Y1:(2,3,4,5),"&
    "Y2:(7,8,9,10),"&
    "A1:(23,22,21,20),"&
    "A2:(19,17,16,15),"&
    "G2:24,"&
    "GND:6,"&
    "VCC:18,"&
    "TDO:11,"&
    "TDI:14,"&
    "TMS:12,"&
    "TCK:13";
constant NT_PACKAGE : PIN_MAP_STRING := ""&
    "G1:1,"&
    "Y1:(2,3,4,5),"&
    "Y2:(7,8,9,10),"&
    "A1:(23,22,21,20),"&
    "A2:(19,17,16,15),"&
    "G2:24,"&
    "GND:6,"&
    "VCC:18,"&
    "TDO:11,"&
    "TDI:14,"&
    "TMS:12,"&
    "TCK:13";
attribute TAP_SCAN_IN of TDI : signal is true;
attribute TAP_SCAN_MODE of TMS : signal is true;
attribute TAP_SCAN_OUT of TDO : signal is true;
attribute TAP_SCAN_CLOCK of TCK : signal is (20.0e6, BOTH);
attribute INSTRUCTION_LENGTH of tt174bct8244 : entity is 8;
attribute INSTRUCTION_OPCODE of tt174bct8244 : entity is
    "EXTEST (00000000, 10000000),"&
    "BYPASS (11111111, 10000100, 00000101, 10001000,
    00000001), " &
    "SAMPLE (00000010, 10000010), " &
    "INTEST (00000011, 10000011), " &
    "HIGHZ (00000110, 10000110), " & -- Bypass with
    outputs high-z
    "CLAMP (00000111, 10000111), " & -- Bypass with bs
    value
    "RUNT (00001001, 10001001), " & - Boundary run test
    "READBN (00001010, 10001010), " & -- Boundary read
    normal mode
    "READBT (00001011, 10001011), " & -- Boundary read
    test mode
    "CELLTST(00001100, 10001100), " & -- Boundary selftest
    normal mode
    "TOPHIP (00001101, 10001101), " & -- Boundary toggle
    out test mode
    "SCANCN (00001110, 10001110), " & - BCR scan
    normal mode
    "SCANCT (00001111, 10001111) " ; -- BCR scan test
    mode
attribute INSTRUCTION_CAPTURE of tt174bct8244 : entity is
    "10000001";
attribute INSTRUCTION_DISABLE of tt174bct8244 : entity is
    "HIGHZ";
attribute REGISTER_ACCESS of tt174bct8244 : entity is
    "BOUNDARY (READBN, READBT, CELLTST,
    INTEST)," &
    "BYPASS (TOPHIP, CLAMP, RUNT, HIGHZ)," &
    "BCR[2] (SCANCN, SCANCT)" ;
attribute BOUNDARY_CELLS of tt174bct8244 :entity is "BC_1";
attribute BOUNDARY_LENGTH of tt174bct80244 :entity is 18;
attribute BOUNDARY_REGISTER of tt174bct8244 : entity is
"0     (BC_1, Y2(4), output3, X, 16, 1, Z)," & - these outputs
       controlled
"1     (BC_1, Y2(3), output3, X, 16, 1, Z)," & - by cell 16
"2     (BC_1, Y2(2), output3, X, 16, 1, Z)," &
"3     (BC_1, Y2(1), output3, X, 16, 1, Z)," &
"4     (BC_1, Y1(4), output3, X, 17, 1, Z)," & -- these outputs
       controlled
"5     (BC_1, Y1(3), output3, X, 17, 1, Z)," & -- by cell 17
"6     (BC_1, Y1(2), output3, X, 17, 1, Z)," &
"7     (BC_1, Y1(1), output3, X, 17, 1, Z)," &
"8     (BC_1, A2(4), input, X)," &
"9     (BC_1, A2(3), input, X)," &
"10    (BC_1, A2(2), input, X)," &
"11    (BC_1, A2(1), input, X)," &
"12    (BC_1, A1(4), input, X)," &
"13    (BC_1, A1(3), input, X)," &
"14    (BC_1, A1(2), input, X)," &
"15    (BC_1, A1(1), input, X)," &
"16    (BC_1, G2, input, X)," &
"16    (BC_1, *, control, 1)," &
"17    (BC_1, G1, input, X)," &
"17    (BC_1, *, control, 1)" ;
end tt174bct8244;
```

All of the lines between the "entity . . ." statement and the "end . . ." statement contain information describing the boundary scan implementation in this type of IC.

The block of lines beginning with the "port . . ." statement declares the names of the IC's signal pins and adds information as to the functions associated with these pins, e.g. inputs, outputs, power, ground, etc.

The "use . . ." statement refers to a set of standard attributes and definitions that apply to all boundary scan IC's.

The "attribute PIN_MAP . . ." statement is a prelude to a number of blocks of lines describing pinouts with pin numbers of various different kinds of packages. This example file includes blocks of lines for the "JT" and "NT" packages.

The "attribute TAP_SCAN_IN . . ." statement declares that the TDI pin is allowed to rest in the "true" condition. The next two "attribute . . ." statements say the same for the TMS and TDO pins.

The "attribute TAP_SCAN_CLOCK . . ." statement declares that the TCK input may be driven as fast as 20.0e6 Hz, i.e. 20 megahertz, and that it may rest in both true and false conditions.

The "attribute INSTRUCTION_LENGTH . . ." statement declares that the instruction register has 8 cells.

The "attribute INSTRUCTION_OPCODE . . ." statement begins a block of lines in which a list of opcodes (i.e. instructions) is defined, each opcode having 8 bits to fill the 8-cell instruction register. In this example, all of the opcodes have two or more possible codes. "BYPASS" has five. The 1149.1 standard only requires the first three—EXTEST, BYPASS, and SAMPLE. The standard further decrees that EXTEST be all zeroes and that BYPASS be all ones. The bit pattern for SAMPLE is not specified by the standard, so will not be the same for every kind of IC. For this kind of IC, it is either 00000010 or 10000010. The other ten instructions shown in this example are not mandated by the standard, and are specific to this particular IC. They may have special purposes unrelated to the inspection of newly assembled circuit boards.

The "attribute INSTRUCTION_CAPTURE . . ." statement simply notes that when a series of instruction bits is being shifted in, 10000001 will be shifted out. The 1149.1 standard mandates that the two rightmost bits of this be "01" regardless of the rest of the bits and regardless of the length of the instruction register.

The "attribute INSTRUCTION_DISABLE . . ." statement allows an ATE to put this kind of IC into a "HIGHZ" state in which no outputs drive. The standard does not require this instruction, and it may not be present in other kinds of IC's.

The "attribute REGISTER_ACCESS . . . " statement declares which of the ten "special" instructions affect which registers. The registers which most concern us with regard to the present invention are the INSTRUCTION, BOUNDARY, BYPASS and IDCODE registers, the first three of which are mandated by the standard. The mandated instructions (EXTEST, BYPASS, SAMPLE) affect the same set of data registers in all IC's complying with the standard, so it is not necessary to declare them in this statement.

The "attribute BOUNDARY_CELLS . . . " statement declares that all cells of the boundary scan data register are of type "BC_1." BC_1 is one of seven cell types defined in an associated language, VHDL.

The "attribute BOUNDARY_LENGTH . . . " statement specifies the number of cells in the boundary scan data register. This simple IC has 18 cells in its BS register.

The "attribute BOUNDARY_REGISTER . . . " statement begins a block of lines in Which each cell in the boundary scan register is described as to its position in the shift register and its operating characteristics. Some cells are output cells, some are inputs and some are control cells. Control cells are used to place outputs or groups of outputs in the high-impedance state.

For a fuller description of BSDL and for exposure to aspects of BSDL which are not covered in the example above, reference is made to additional details in the text of the BSDL standard.

Difficulty Obtaining Accurate BSDL Files

BSDL is necessary for automatic program generation. When boundary scan and BSDL standards were first published, it was widely hoped and believed that designers of IC's adopting the standard would create and publish BSDL files for their circuits. Some problems have come up, though. Although BSDL is simple and straightforward, it is nonetheless a rare and specialized language which few IC designers have made the effort to learn. Teachers of BSDL are scarce, reducing the likelihood that a given IC designer will receive any training in BSDL. Those who do write BSDL files have no easy way of verifying that they have done it correctly. To make matters worse, some IC manufacturers even regard BSDL files as proprietary information, and do not make BSDL files available to the circuit board assemblers as a matter of policy. For these reasons, it is not easy to get an accurate BSDL file for an IC.

So BSDL files, if available, often contain errors. Software exists that can examine a BSDL file to see if it contains errors of a lexical, syntactic or semantic-consistency nature. This kind of software is valuable, but still cannot guarantee that a given BSDL file correctly describes the boundary scan features in a given IC.

It is not easy to debug faulty BSDL files, or even to know that they are faulty: the effect of a single change in the BSDL code may only be seen after several intermediate process steps have been performed, in which the BSDL code is not the only potential source of error. Thus an erroneous behavior in the performance of the ATE might be due to an error in a BSDL file, or it might be due to an error in some other input to the program generation process.

For all of these reasons, lack of reliable BSDL files is a weakness in the boundary scan technique and an impediment to its broad adoption.

It would, therefore, be desirable to provide a way to make BSDL files more available, and more accurate. If an automatic way could be found to prepare accurate BSDL files, it would not be necessary for a human to learn to write or read the BSDL language, or indeed interact with it at all. A BSDL file automatically prepared by such an automatic process would be later read by another automatic process to produce a correct test program.

A test engineer possessing such a method and apparatus could obtain a BSDL file directly from a sample IC, without having to obtain or rely on other documentation about the IC.

SUMMARY OF THE INVENTION

The present invention overcomes the above-noted failings of the prior art by providing a method and apparatus for automatically generating a BSDL file describing the structure of the boundary scan hardware in a device that is designed to conform to the IEEE 1149.1 standard.

The invention works by stimulating and measuring a sample IC of the type for which the BSDL information is desired. The invention is equipped with a complement of test channels sufficient in number to allow the invention to communicate with all of the sample IC's pins. The test channels are controlled by a computer, so software programs running in the computer may apply stimuli and detect responses.

A human operator must first connect the pins of the sample IC to the test channels of the hardware unit. The unit for this purpose is provided with a pin-grid array (PGA) socket and various adapters. IC's packaged in pin-grid array packages may be placed directly in the PGA socket. Other kinds of packages are placed in adapters, and the adapters placed in the PGA socket. An array of DIN connectors is also provided, so that special fixtures may be made as needed and connected to the invention.

The human operator also supplies some information about the IC, specifically including which IC pins are power supply, which are ground, which are the four (or five) pins associated with the TAP, and which are regular signal pins. A text editor is provided for entering this information into the computer.

Users lacking IC documentation deduce this information from a schematic diagram of a circuit board in which the IC is used. Such a schematic is almost always available to a test engineer whose job it is to prepare test programs for a circuit board in which an IC of the type in question is used.

Beginning with the sample IC and the above-mentioned pin identification information, the method and apparatus of the present invention make a series of exploratory tests on the pins of the sample IC in order to automatically determine (1) the length of the instruction register; (2) the length of the boundary-scan register; (3) which pins are outputs and which pins are inputs, and which are I/O or tri-state outputs; (4) the order that the pins are represented in the boundary-scan register; (5) the identity of the control cells in the boundary-scan register that control I/O and tri-state pins, along with which pins each controls and the sign of the control; (6) the identity of the SAMPLE/PRELOAD instruction; and (7) the identity of the IDCODE instruction and ID code, if present.

The present invention then formats this information into standard BSDL language, and stores it all in a disk file. The BSDL file may later be used by a scan-oriented automatic program generation software system such as the aforementioned Teradyne VICTORY software system. Readers of the IEEE standards will note the standards allow many features beyond those described here, and also that BSDL may describe those additional features.

The features listed here are sufficient to allow the boundary scan program generation software to develop patterns for the ATE testing tasks described in the earlier parts of this discussion.

More particularly, the method of the present invention automatically determines parameters of boundary scan circuitry of indeterminate configuration incorporated in an integrated circuit by applying predetermined signals to selected pins of the integrated circuit, detecting output signals on other selected pins of the integrated circuit, and determining parameters indicative of the boundary scan circuitry of indeterminate configuration as a function of the output signals. Another aspect of the invention is the creation of a boundary scan description language file describing the boundary scan circuitry of indeterminate configuration as a function of the detected parameters.

The method of the present invention also contemplates the identification of a number of pins of the integrated circuit, for example the power and ground pins and the boundary scan test point access pins. Then, predetermined signals are applied to the boundary scan test access point pins of the integrated circuits in order to determine the parameters of the boundary scan circuitry of indeterminate configuration.

Even more particularly, the method of the present invention comprises applying predetermined signals to the pins of the integrated circuit to automatically determine a length of an instruction register within the boundary scan circuitry, to automatically determine a length of a boundary scan register within the boundary circuitry, to automatically determine which of the pins are output pins, which of the pins are input pins, which of the pins are input/output pins, and which of the pins are tri-state output pins, to automatically determine an order that the pins are represented in the boundary scan register, to automatically determine an identity of control cells in the boundary scan register that control input/output and tri-state output pins, along with which pins each controls, and the sign of the control, to automatically identify a SAMPLE/PRELOAD instruction of the boundary scan circuitry, and to automatically identify an IDCODE instruction and an ID code of the boundary scan circuitry.

The apparatus of the present invention includes a fixture which is adapted to hold an integrated circuit under test, the fixture including channel circuitry adapted to apply predetermined test signals to selected pins of the integrated circuit, and to detect output signals on other selected pins of the integrated circuit. The apparatus also includes a programmed computer, operatively connected to the fixture and responsive to a pin count of the integrated circuit, an identity of the power and ground pins of the integrated circuit, and an identity of boundary scan test access point pins of the integrated circuit. The programmed computer incorporates means for applying predetermined signals to the pins of the integrated circuit in order automatically to determine a length of an instruction register and a length of a boundary scan register within the boundary scan circuitry, to automatically determine which of the pins are output pins, which of the pins are input pins, which of the pins are input/output pins, and which of the pins are tri-state output pins, to automatically determine an order that the pins are represented in the boundary scan register, to automatically determine an identity of control cells in the boundary scan register that control input/output and tri-state output pins, along with which pins each controls, and the sign of the control, to automatically identify a SAMPLE/PRELOAD instruction, and to automatically identify an IDCODE instruction and an ID code of the boundary scan circuitry.

These and other features and advantages of the present invention will become apparent to those of ordinary skill in the art with reference to the following detailed description and appended drawings.

DETAILED DESCRIPTION

Figure 1:
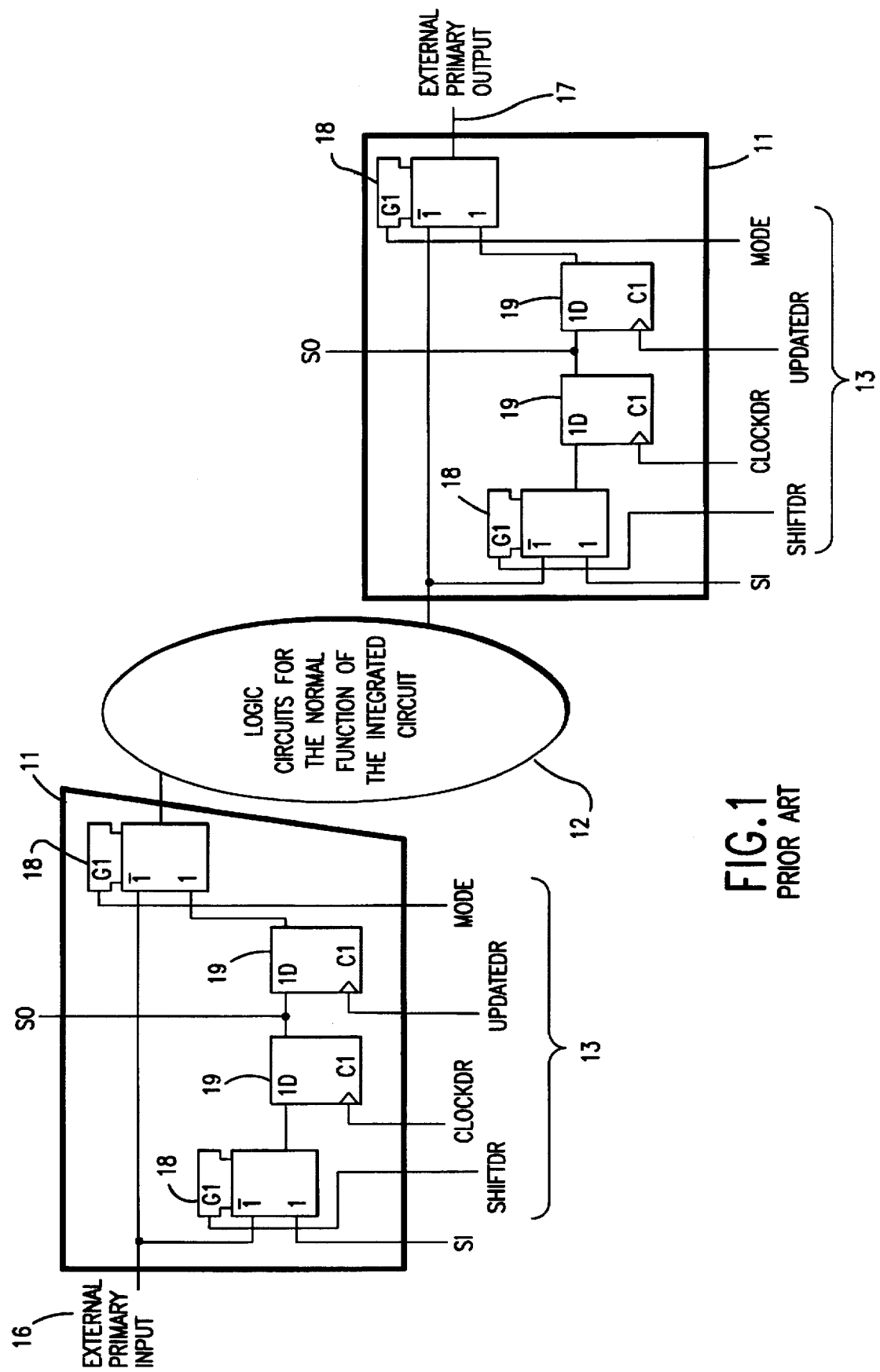
FIG. 1 is a block diagram showing two typical prior art boundary-scan cells, one at an input pin and another at an output pin.
Figure 2:
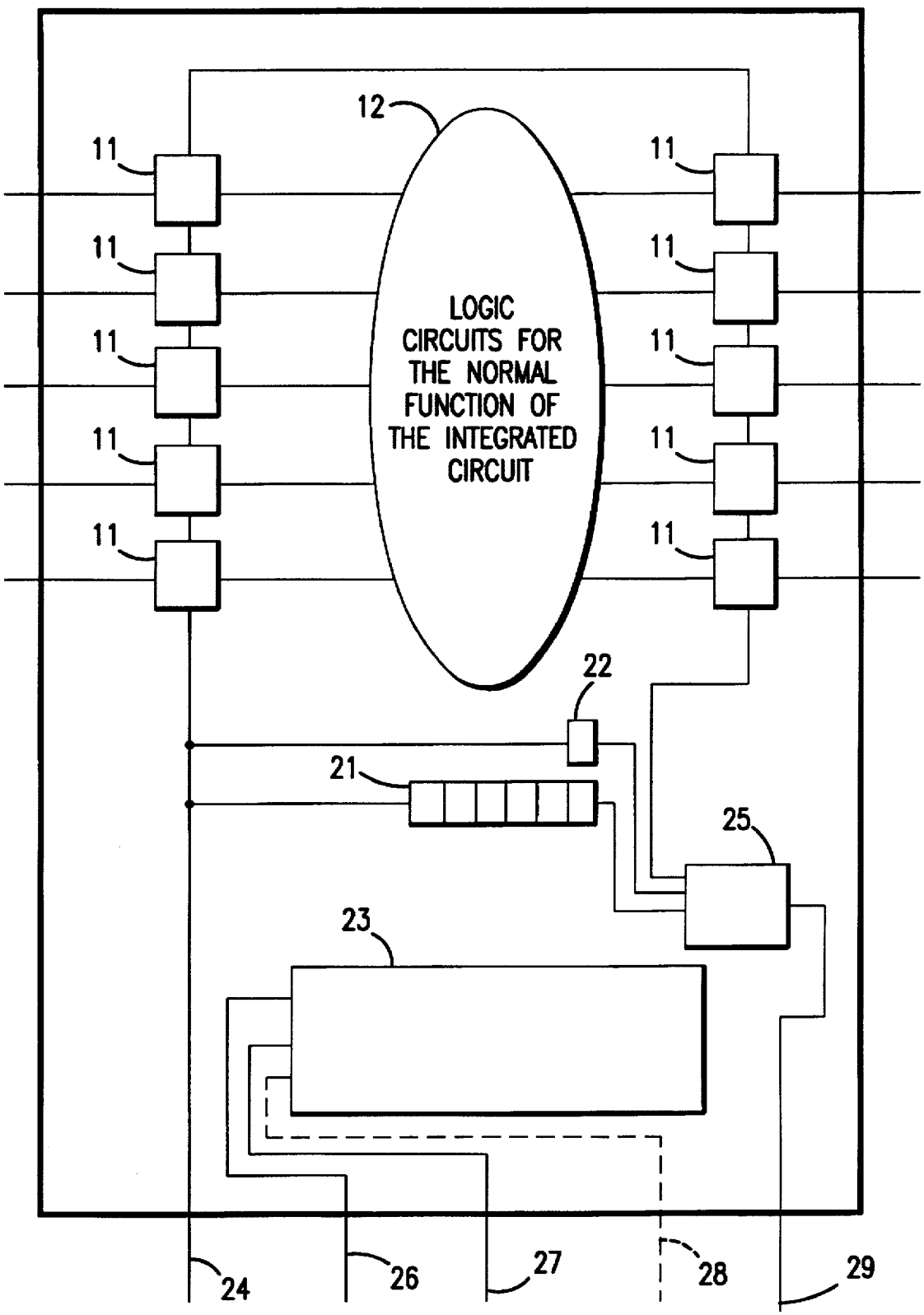
FIG. 2 is a block diagram of a typical known device having boundary-scan test capability.
Figure 3:
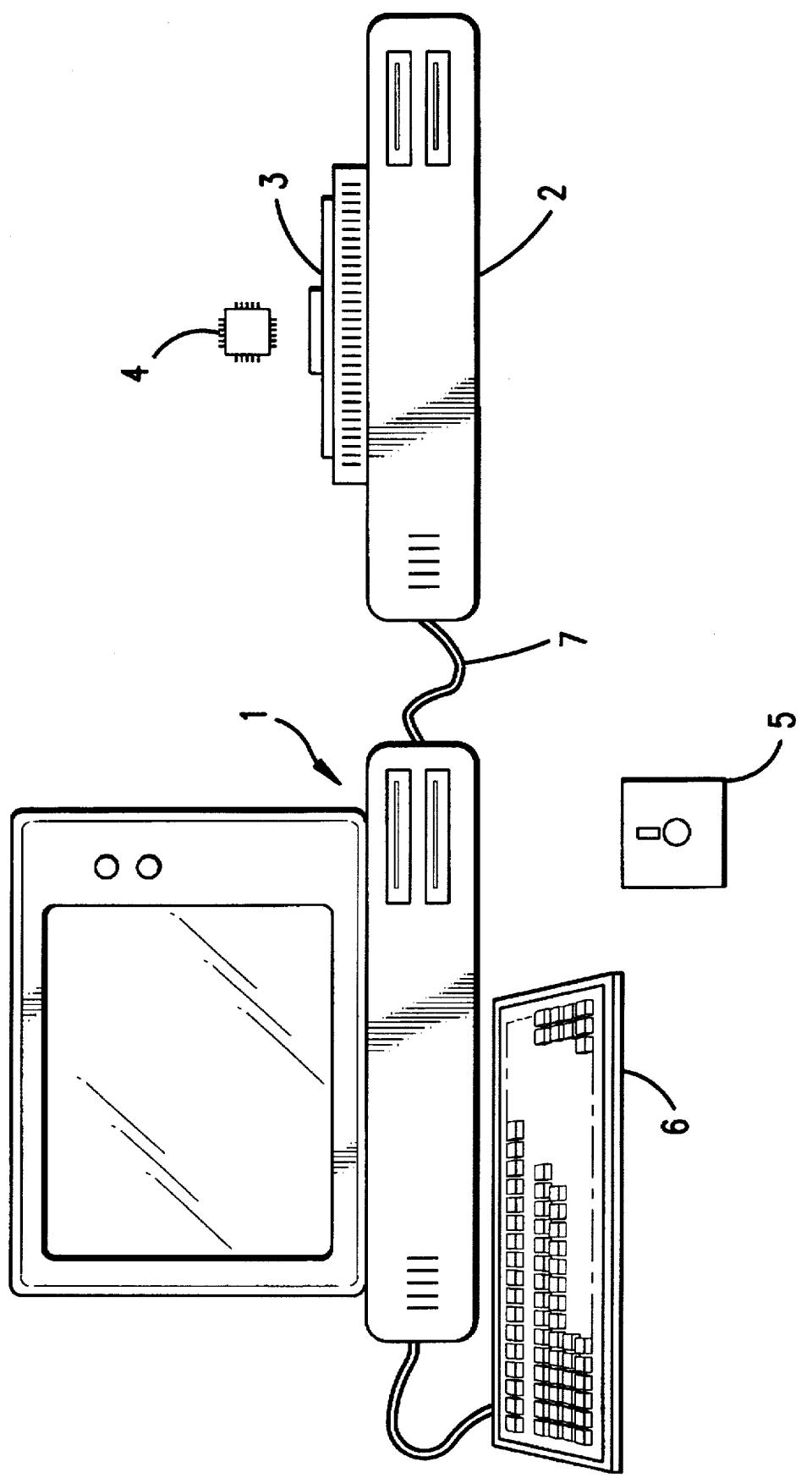
FIG. 3 is the apparatus of the present invention.

Referring first to FIG. 3, the apparatus of the present invention is presented. Computer 1 is connected to a hardware unit 2 by means of a connecting cable 7. In an exemplary embodiment, computer 1 is a "personal computer" of the type generally known in the art as a "PC", or "PC clone". It is well understood, however, that the services provided by the PC clone could be provided by any of a great number of different kinds of computers.

Hardware unit 2 incorporates a socket 3 that connects channel circuits of the hardware unit 2 to a sample IC 4 that incorporates boundary-scan circuitry, and for which a BSDL description file is to be prepared. A keyboard 6 provides a control means for introducing operator input into the computer 1. A data storage media 5, such as, for example, a floppy disk, tape, CD ROM, or the like, represents one of many possible methods of transferring files of information into or out of computer 1 and hardware unit 2.

Acting on commands from the computer 1 and procedures therein contained (described in more detail below with reference to the flow charts and tables of FIGS. 4–12), hardware unit 2 stimulates selected pins of the sample IC 4 which stimulus logic levels, and detects response levels on other selected pins. After a human operator enters some initial information in a setup step, computer 1 operates in accordance with the methods presented in flow chart form in FIGS. 4–12 to generate a BSDL description file for IC 4.

Although the disclosed exemplary embodiment finds the hardware unit 2 and computer 1 in a separate chassis connected by cable 7, it is understood that combining computer 1 and hardware unit 2 into a single common chassis, eliminating the cable 7, would be possible without departing from the spirit and scope of the invention.

The hardware unit 2 is equipped at a minimum with at least the number of channels necessary to serve all pins on the sample IC 4. In the exemplary embodiment, there are 512 channels, but the invention is not restricted to this number and may easily be built to service a larger of smaller number as requirements of the day and purse of the user dictate. Each channel is required to provide the follow features at a minimum:

- Ability to drive an input on the sample IC to a logic L (low) or logic H (high) level, through a controlled source impedance.
- Ability to assume a predetermined impedance/voltage state when not driving to either of the L or H levels. In the exemplary embodiment, the channel can supply an impedance of 10,000 Ohms to a voltage midway between the L and H voltage levels.
- Ability to detect and resolve the level of an output pin on the IC as a U (up) or D (down) or third, high-impedance state, state X.

In this embodiment a third-state detection is done without causing an excursion on the pin of the sample IC. This approach was chosen to avoid introducing unwanted transitions on pins that might be inputs as well as three-state outputs, for example, so-called bidirectional pins.

Additional details of the structure and function of the individual channels of hardware unit 2 are provided in U.S.

patent application Ser. No. 08/039,947, filed Mar. 29, 1993, assigned to the same assignee as the present invention, the disclosure of which is expressly incorporated herein by reference.

FIGS. 4–12 present in flow chart and tabular form the operation of the apparatus depicted in FIG. 3, in accordance with the method of the present invention. In practice, the flow charts of FIGS. 4–12 are coded in appropriate form and stored on data storage media 5, which, when loaded into computer 1, enables computer 1 to perform the methods of the present invention to create BSDL files describing the boundary-scan parameters of the IC in question.

Figure 4:
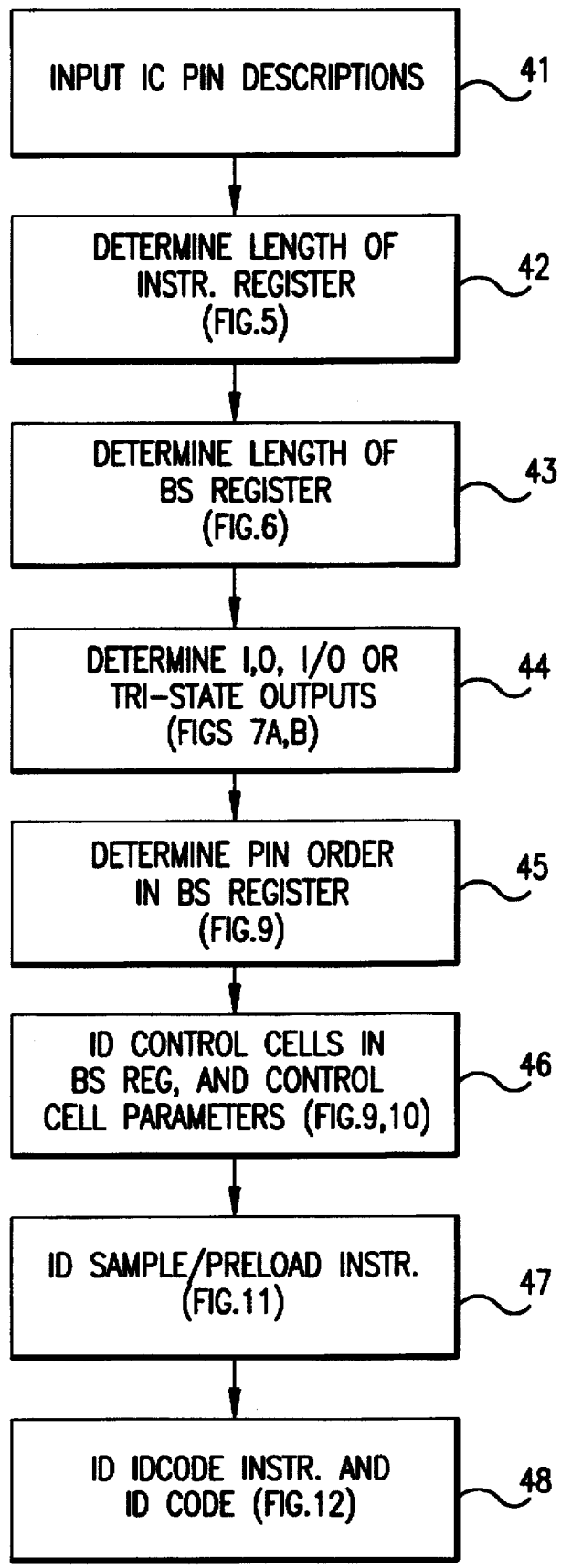
FIGS. 4–12 are flow charts and tables illustrating the operation of the apparatus of FIG. 3, in accordance with the method of the present invention.

Referring to the flow chart of FIG. 4, depicted is the method of the present invention to determine a BSDL file for an IC incorporating boundary scan circuitry of unknown implementation. The details of the individual routines shown in FIG. 4 are depicted in the flow charts and tables of FIGS. 5–12, described in more detail below.

After completion of the method summarized in FIG. 4, a BSDL file exists for the IC under question, including the following data: (1) the length of the instruction register; (2) the length of the boundary scan registers; (3) the identity of which pins are outputs, which pins are inputs, and which pins are I/O or tri-state outputs; (4) the order that the pins are represented in the boundary scan register; (5) the identity of the control cells in the boundary scan register, and the identity of which control cells control I/O and tri-state pins, along with which pins each controls and the sign of that control; (6) the identity of the SAMPLE/PRELOAD instruction; and (7) the identity of the IDCODE instruction and ID code, if they exist.

Referring to FIG. 4, and beginning in step 41, the user inputs the pin count for the device, and also identifies the power and ground pins, as well as the TAP pins, TCK, TMS, TDI, TDO and, if present, TRST*.

Control then passes to block 42 where the length of the instruction register is ascertained, and then onto block 43 where the length of the boundary scan register is ascertained. Then, in step 44, it is determined which of the IC pins are outputs, which are inputs, and which are I/O or tri-state outputs.

Control then passes to block 45 where the order of the pins represented in the boundary scan register is ascertained. Then, in block 46, the control cells in the boundary scan register are identified, and it is determined which cells control I/O and tri-state pins and the sign of the control. Control then passes to block 47 where the SAMPLE/PRELOAD instruction is identified. Finally, in block 48, it is determined whether or not the IC's boundary scan implementation includes the IDCODE function, which is not mandated but optional under the 1149.1 standard. If an IDCODE is implemented in the IC, the IDCODE instruction and ID code are identified.

Referring now to FIGS. 5–12, presented in more detail in both flow chart and pseudocode form, are the operations depicted by steps 41–48 are FIG. 4. For each of the flow charts within FIGS. 5–12, a pseudocode description of the method of operation is presented in the text, and step numbers have been inserted into the text to indicate where in the flow chart these functions are being performed. The following names are adopted for the variables in pseudocode and flowchart alike:

C number of cells in a register, n identifying number of a cell in a register,

P number of bits needed to represent n in binary, x pointer (less than P) of a bit in number n; also, pointer to one of the counting patterns, $CP_x$ the xth counting pattern, and q a package pin identifier.

In reading the pseudocode and flow charts, follow the convention that "Go to xxx state" means "advance the TAP controller state machine to the xxx state by clocking in an appropriate string of TMS values." For example, one way to "Go to Shift-IR state" would be to first reset the TAP controller by clocking in five successive ones on the TMS pin, then advancing to the Shift-IR state by clocking in TMS values of 0,1,1,0,0. TMS sequences for this and other state targets are described in detail in Chapter 5 of the 1149.1 standard.

When pseudo code calls for the apparatus to "Shift in the xxx instruction," the apparatus will perform three actions: first, unless explicitly called for in a previous step, advance the sample IC's TAP controller state machine to the Shift-IR state; second, clock in the xxx instruction's bit sequence on the TDI input; finally, unless explicitly called for in the following step, go to the Update-IR state to activate the instruction. These mechanisms are all explained fully in the text of the 1149.1 standard.

Figure 5:
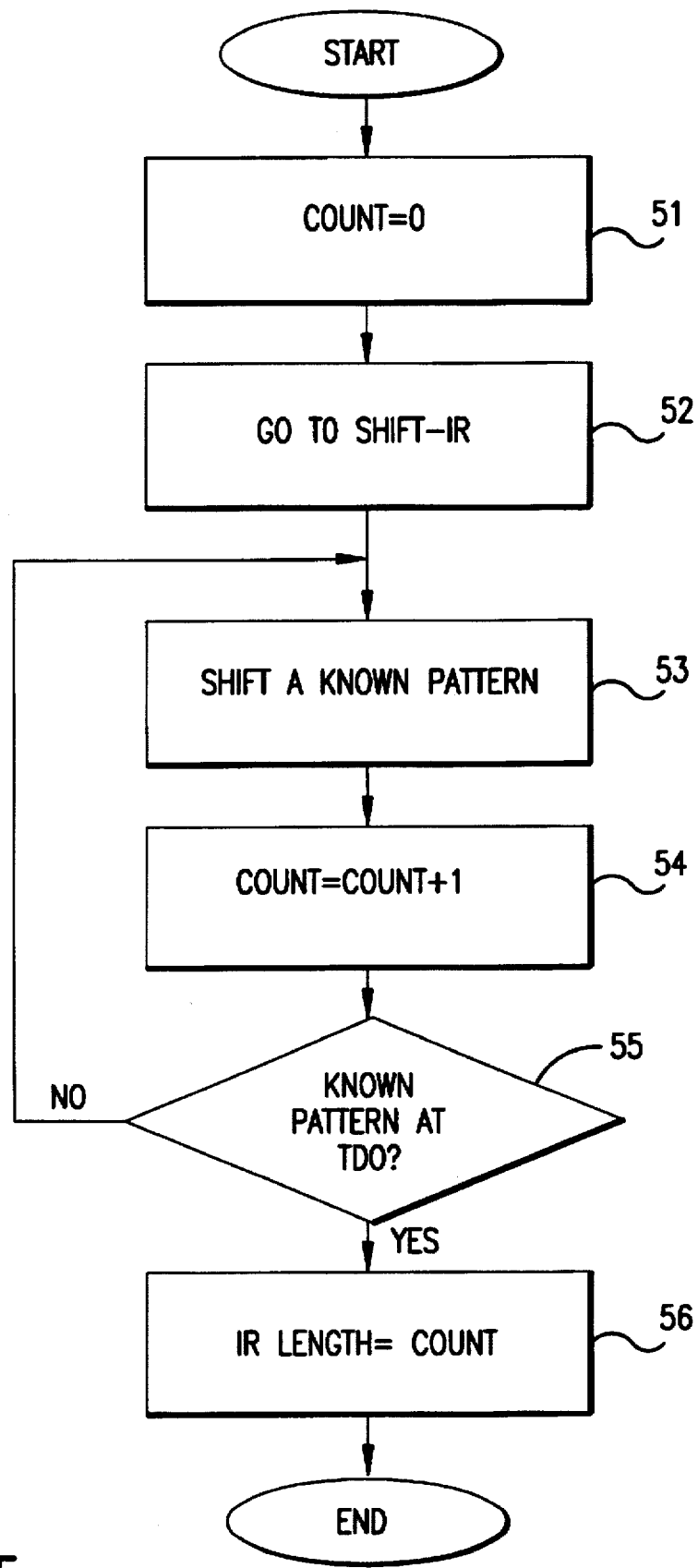

Referring first to FIG. 5, the present invention automatically determined the length of the instruction register in the sample IC.

---

Set a counter to zero (step 51)
Go to Shift-IR state (step 52).
Shift a known pattern into TDI (step 53), and count
   clocks (step 54) until that pattern appears at TDO
   (step 55).

---

At the completion of this routine, the length of the sample IC's instruction register is known to be equal to the number of clocks counted (step 56).

Figure 6:
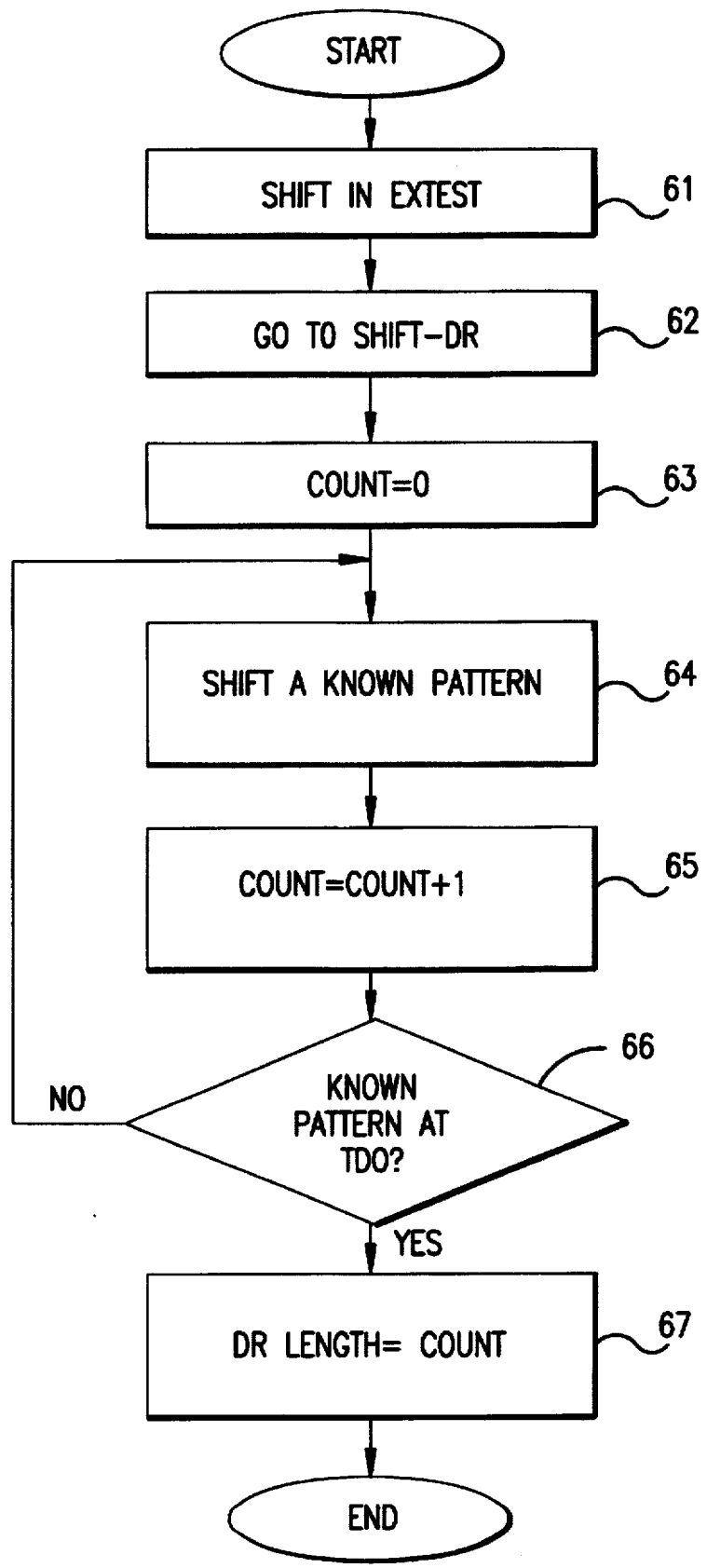

Then, with reference to FIG. 6, the present invention automatically determines the length of the sample IC's boundary scan register.

---

Go to Shift-IR state.
Shift in the EXTEST instruction (step 61) - all 0's for the
   length of the instruction register.
Go to Update-IR state to activate the EXTEST instruction.
Go to Shift-DR state (step 62).
Zero a counter (step 63).
Shift unknown pattern into the boundary scan register
   through TDI (step 64), and count clocks (step 65)
   until that pattern appears at TDO (step 66).

---

At the completion of the routine of FIG. 6, the sample IC's boundary scan register length is known to be equal to the number of clock counts (step 67).

Referring now to FIGS. 7A, 7B and 8A and 8B, the present invention finds the sample IC's output pins and control cells, using "counting patterns." Counting patterns have the following property of interest: A boundary scan register in which the number of cells is C may be successively loaded with $INT(\log_2(C+1))+1)$ such patterns, and each cell in the register will undergo a unique series of state changes. This makes it possible for an external observer to identify individual cells in the boundary scan register.

Figure 7A:
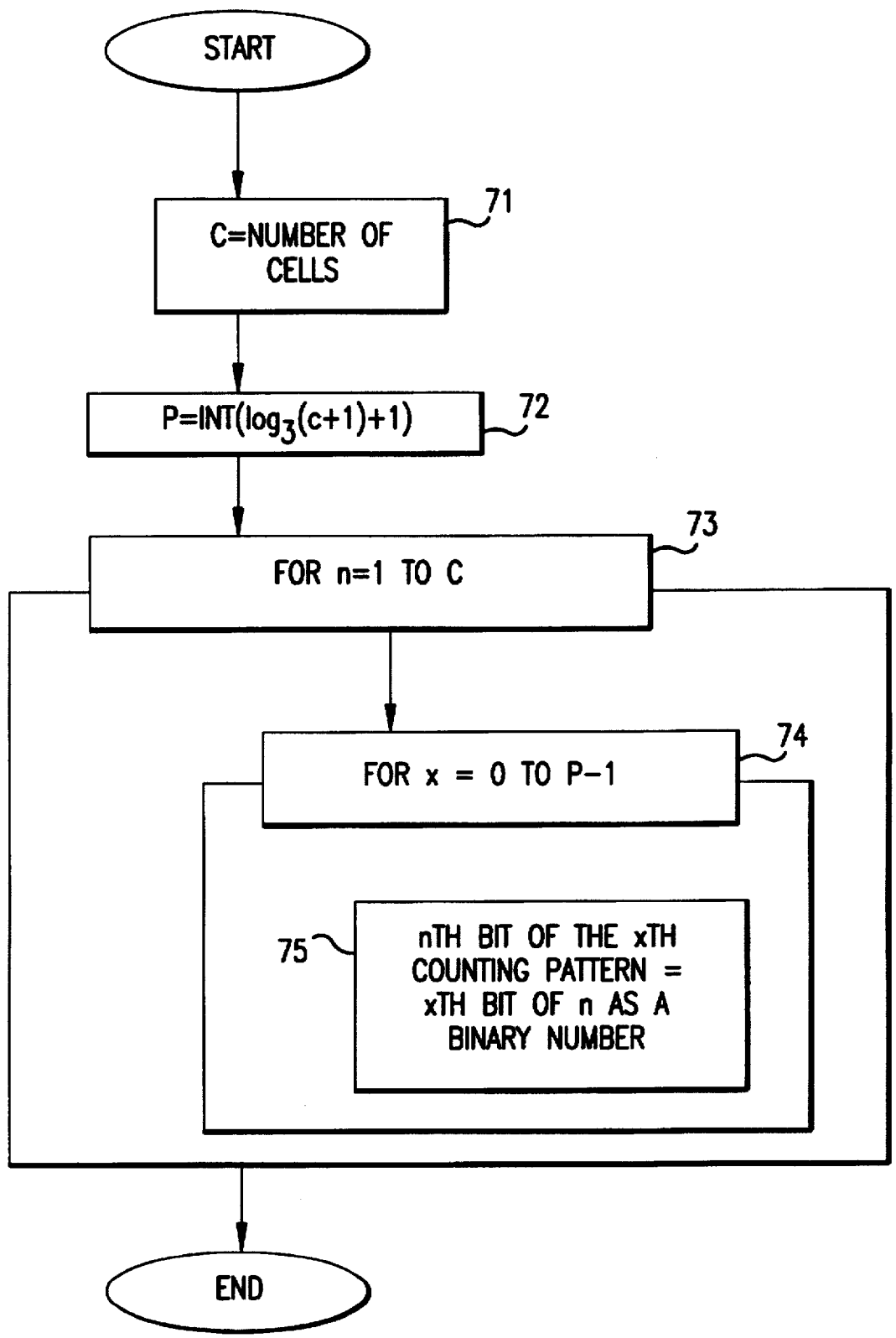
Figure 8A:
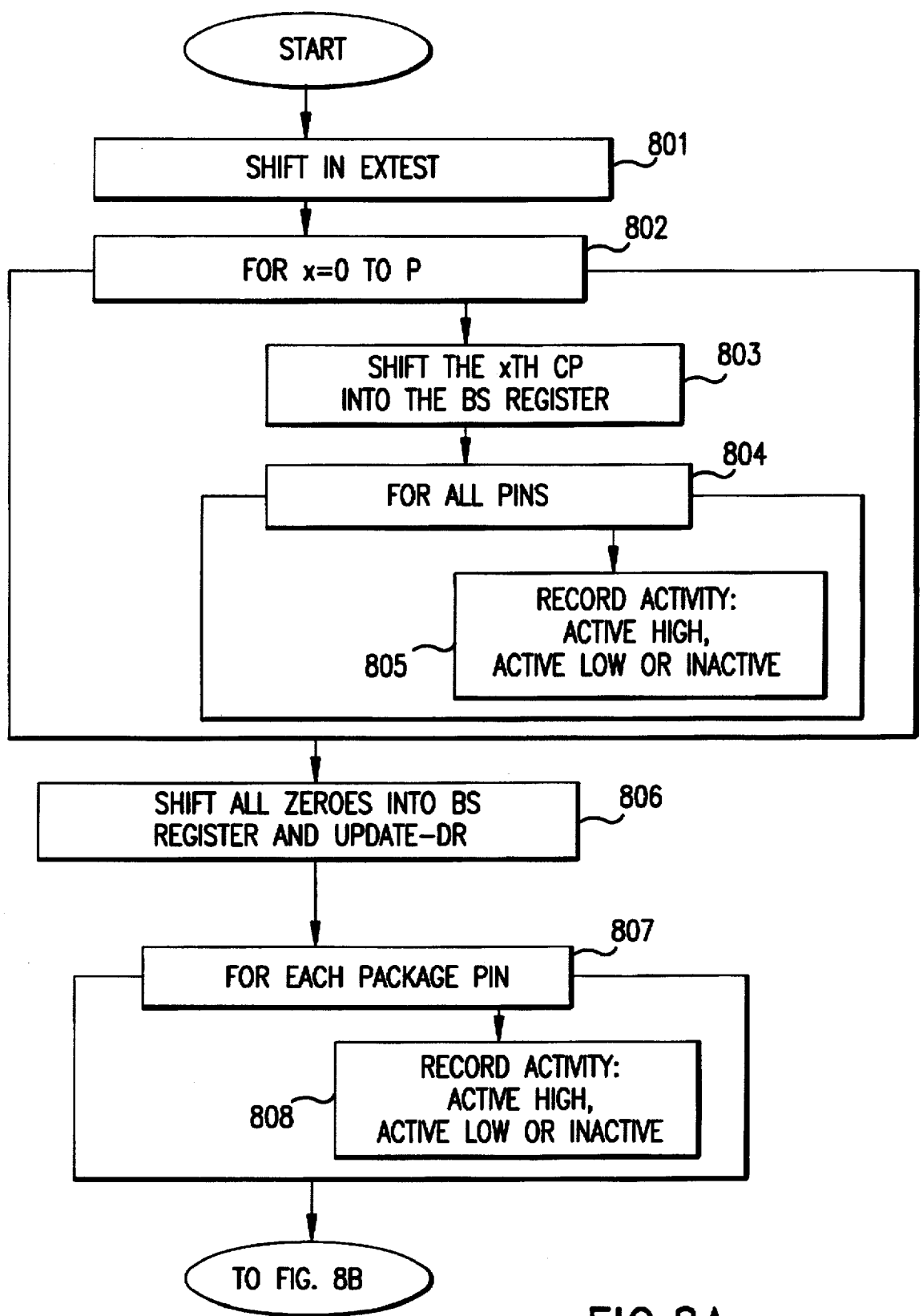
Figure 8B:
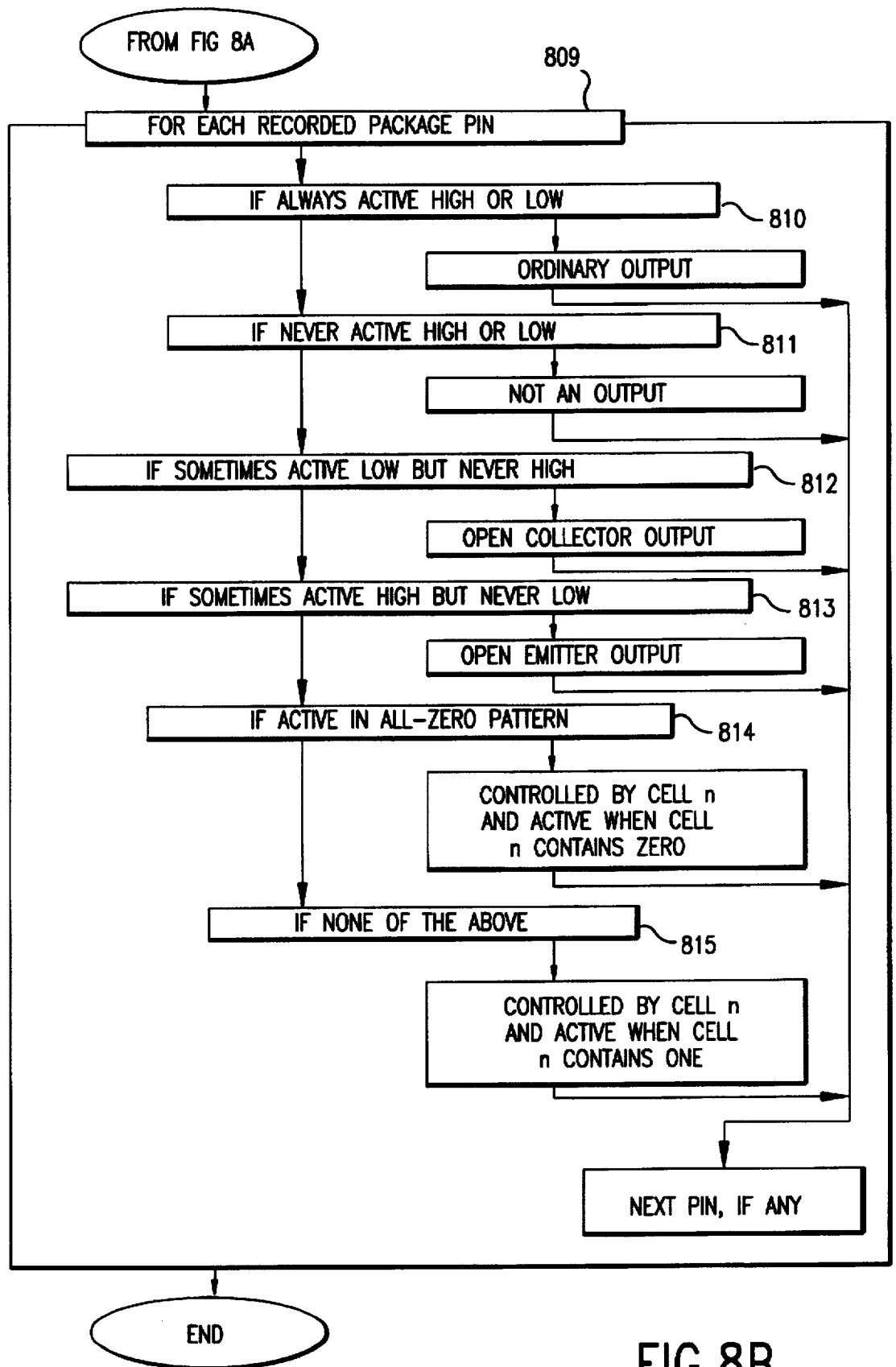

Referring first to the example of FIGS. 7A and 7B, a counting pattern is built that is used in the method shown in the flow chart of FIGS. 8A and 8B to find the output pins and control cells. The illustrative example boundary scan register of 7A and 7B is a register of 30 cells, though in practice, BS registers of many other lengths exist. The necessary number P of counting patterns is calculated, according to the formula given above, thus: Take $\log_2$ of 31 and get 4.95. Add 1, making the total 5.95. Take the INT function of 5.95 (i.e. discard the fractional part to the right of the decimal point, but retain the integer part), and obtain a final result of 5. So, P=5. Five counting patterns will suffice, and each cell may be assigned a number n greater than zero in which five bits are sufficient to represent the number n in binary.

Each cell in the BS register is assigned a unique identifying number n having P bits when expressed in binary. The first cell is numbered "1", the second "2," and so forth. The 20th cell is numbered "20." If conventional binary weights of 1,2,4,8,16 are given to the bits of number n from left to right, the sequence 00101 adds up to 0+0+4+0+16=20. Note in FIG. 7B, BS cell number 20 has the pattern sequence 00101 extending to the right as the 20th elements of the five counting patterns $CP_0 \ldots CP_4$.

When counting patterns $CP_0 \ldots CP_4$ are successively loaded into the BS register, as illustrated in FIG. 7B, cell 20 will take on a sequence of values 0,0,1,0,1. Every other cell in the register will exhibit a different, but equally unique, sequence as shown in FIG. 7B. Each cell, in effect, speaks its identifying number n in binary as the counting patterns are successively loaded into the BS register.

The flow chart of FIG. 7A operates as described in pseudocode immediately below.

---

Set C equal to the number of cells in the sample IC's
  BS register (step 71).
Determine the number of counting patterns P for a
  register of length C cells: P =
  INT($\log_2$(C+1)) + 1. (step 72)
For each cell n (step 73),
  Assign a binary number n according to the
  cell's position in the register, starting
  with n=1. Then,
  For each position x of the P bit positions
  (step 74),
    Write the xth bit of that cell's number n
    into position n of the xth counting
    pattern $CP_x$ (step 75).
  End for each position x.
End for each cell n.

---

Referring now to FIG. 8A, the use of the counting pattern generated by the method of FIG. 7A, and depicted, for example in FIG. 7B, to find the sample IC's output pins is shown.

---

Shift in the EXTEST instruction (step 801).
For each counting pattern x < P (step 802),
  Shift the bits for counting pattern $CP_x$ into the BS
  data register (step 803).
  For each pin q <= C (step 804),
    Record the drive state (0 for inactive or 1
    for active, either high or low) in an
    activity array for pin q at position x.
    Note also the logic state of the pin if
    active (step 805).
  End for each pin q (step 804).
End for each counting pattern x < P (step 802).
Shift all 0 bits into the BS data register (step 806).
For each pin q (step 807),
  Record the drive state (0 for inactive or 1
  for active, either high or low) in an
  activity array for pin q at position x.
  Note also the logic state of the pin if
  active (step 808).
End for each pin q (step 807).
Continue to flow chart of FIG. 8B.

---

Next, and continuing with the flow chart of FIG. 8B, the data collected is analyzed to determine which cells are output control cells, which cells they control, and the sign of that control. The term "open-collector" is used in the discussion below to signify an IC output structure which can pull low but not pull high. It is recognized that logic IC's containing boundary scan circuits may be implemented in semiconductor technologies in which transistor collectors, per se, are absent, or in which the pull-low capability is provided by a means other than a collector, for example a drain of a field-effect transistor. Nonetheless, the term "open-collector" is in wide use and is generally understood to describe an output which cannot pull high. Similar comments, though of a complementary nature, apply to the term "open-emitter," which indicates an output capable of pulling high but not of pulling low.

---

Continuing with reference to FIG. 8B,
  For each pin q (step 809),
    If the activity array for pin q is all 1's
    (step 810), then pin q is an ordinary
    output pin.
    Else if the activity array for pin q is all 0's
    (step 811), it is not an output pin.
    Else if the pin was ever active low but never
    active high (step 812), then it is an
    open-collector output.
    Else if the pin was ever active high but
    never active low (step 813), then it is
    an open-emitter output.
    Else if pin q was active high or low in the all
    0's pattern (step 814),
      Pin q is controlled by the cell n whose
      number is represented by the
      complement of the activity array
      collected for pin q, and
      Pin q is an active output whenever that
      control cell contains a 0.
    Else, (step 815) pin q is controlled by the
      cell whose number n is represented by
      the activity array collected for pin q,
      and Pin q is active for output whenever
      that control cell contains a 1.
    Endif.
  End for each pin q (step 809).

---

It should be noted that an open-collector pin essentially controls itself and is active when it is low. Thus, it will be active when the BS register contains all 0's, and it will show the complement of its own output data cell number in the bit sequence. This will correctly indicate that it is disabled when it is a logic 1. The inverse is true for an open-emitter pin.

Figure 9:
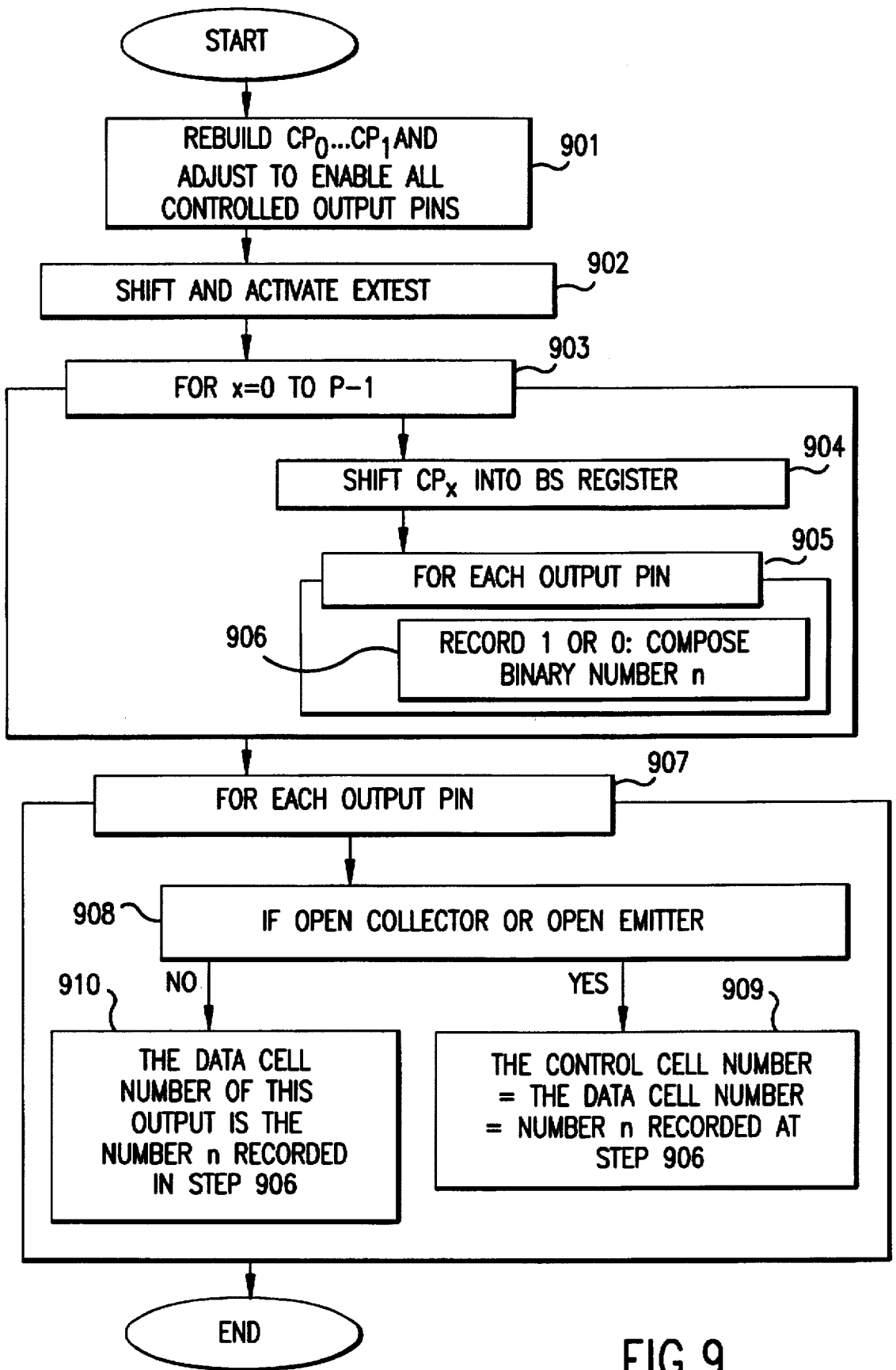

Referring now to FIG. 9, the present invention automatically determine the output data cells to the pins of the IC under consideration.

---

Rebuild the counting patterns as previously
  described, but adjust the bits for all the
  control cells to all one or all zero as
  required to put all controlled data cells
  into their active output states (step 901).
Shift in the EXTEST instruction and activate it
  (step 902).
  For each counting pattern x < P (step 903),
    shift the bits for counting pattern x into
    the BS data register and activate it (step
    904).
    For each output pin q (step 905),
      Record the logic state (1 for high or 0
      for low) in a bit array for pin q
      at position x in the bit array and
      compose a binary number n from
      these bits (step 906).
    End for each output pin (step 902)
  End for each counting pattern (step 903)

```
For each output pin q (step 907),
    If the pin is an open-collector pin or an open-
        emitter pin (step 908),
            the data cell for pin q is the same as the
                control cell for pin q and the cell
                number equals the binary number n
                recorded in step 96 (step 909).
        Else the data cell for pin q is the one whose
            number n is represented by the bit array
            collected for pin q (step 910).
        Endif.
End for.
```

At the completion of the method depicted in the flow chart of FIG. 9, there is a check made to determine that all output pins have boundary scan cells assigned to them, and that all controlled outputs have control cells assigned. In addition, there is a check made that the number of remaining unassigned boundary scan positions is the same as the number of input pins. If any of these checks should fail, an error message appropriate to the failure is printed. There are at least two possible sources of error to consider: the operator might have assigned pins incorrectly before beginning the automatic learning processes; or the IC design might not actually comply with the 1149.1 standard.

Figure 10A:
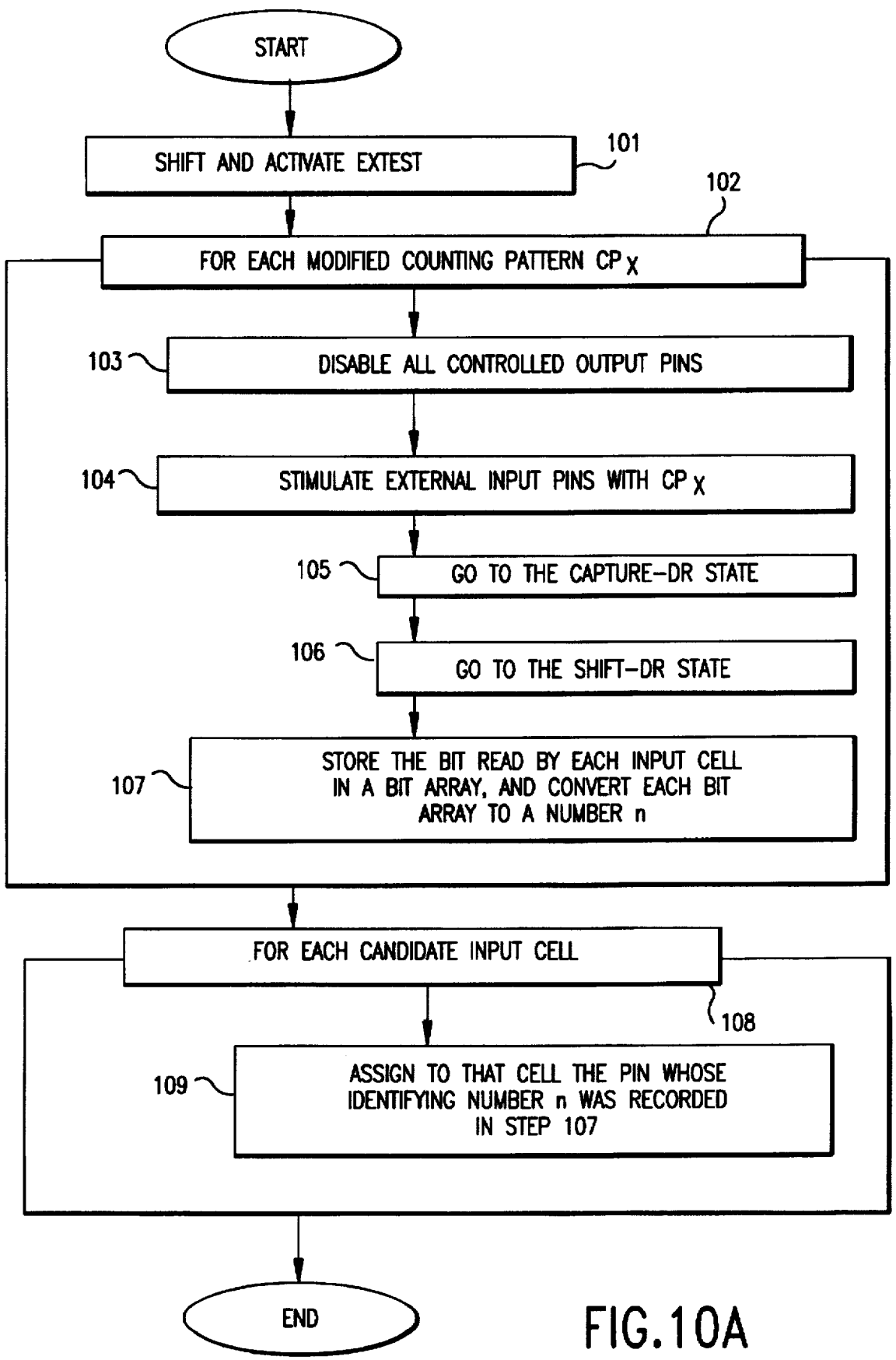
Figure 11A:
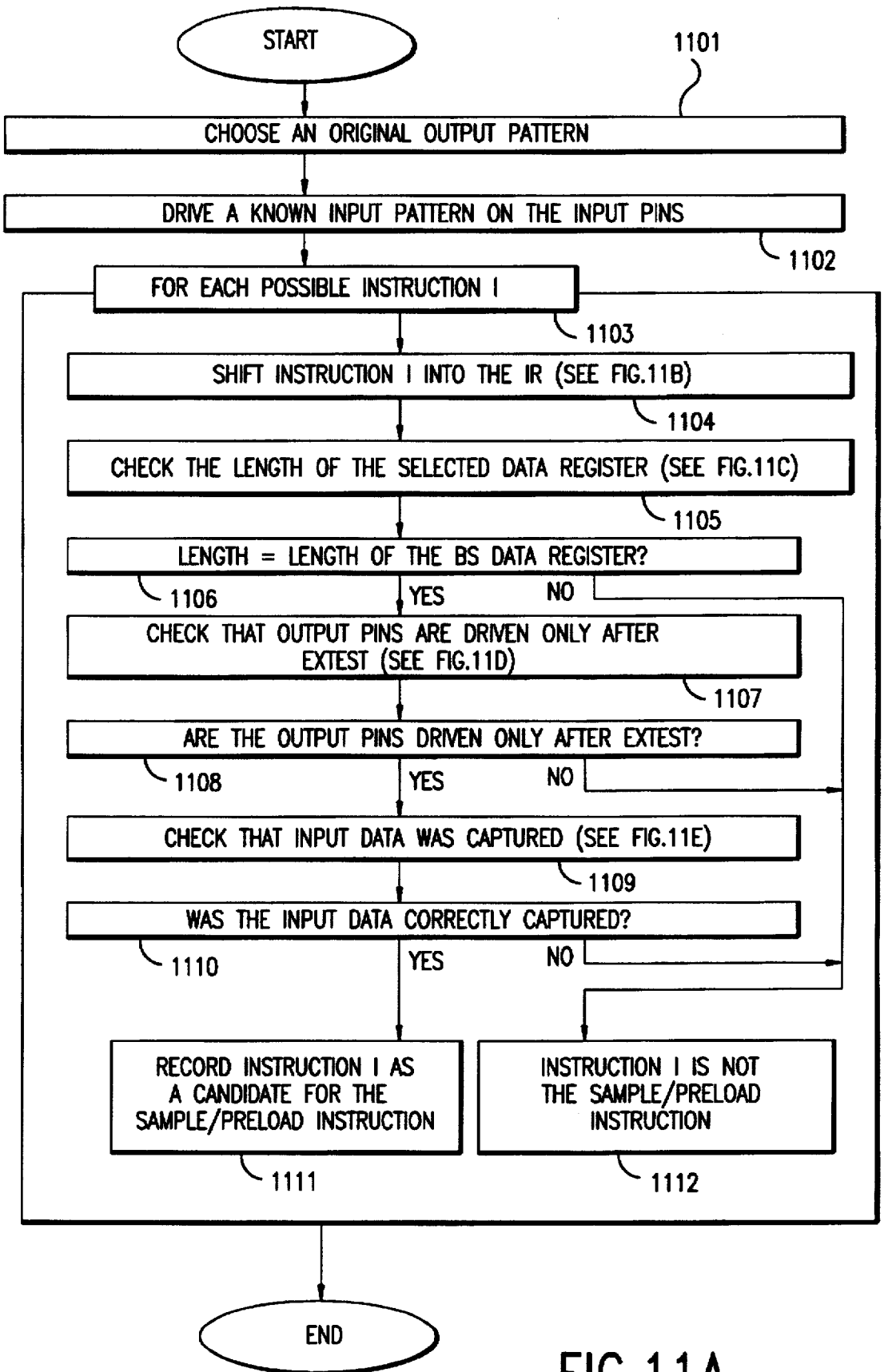
Figure 11B:
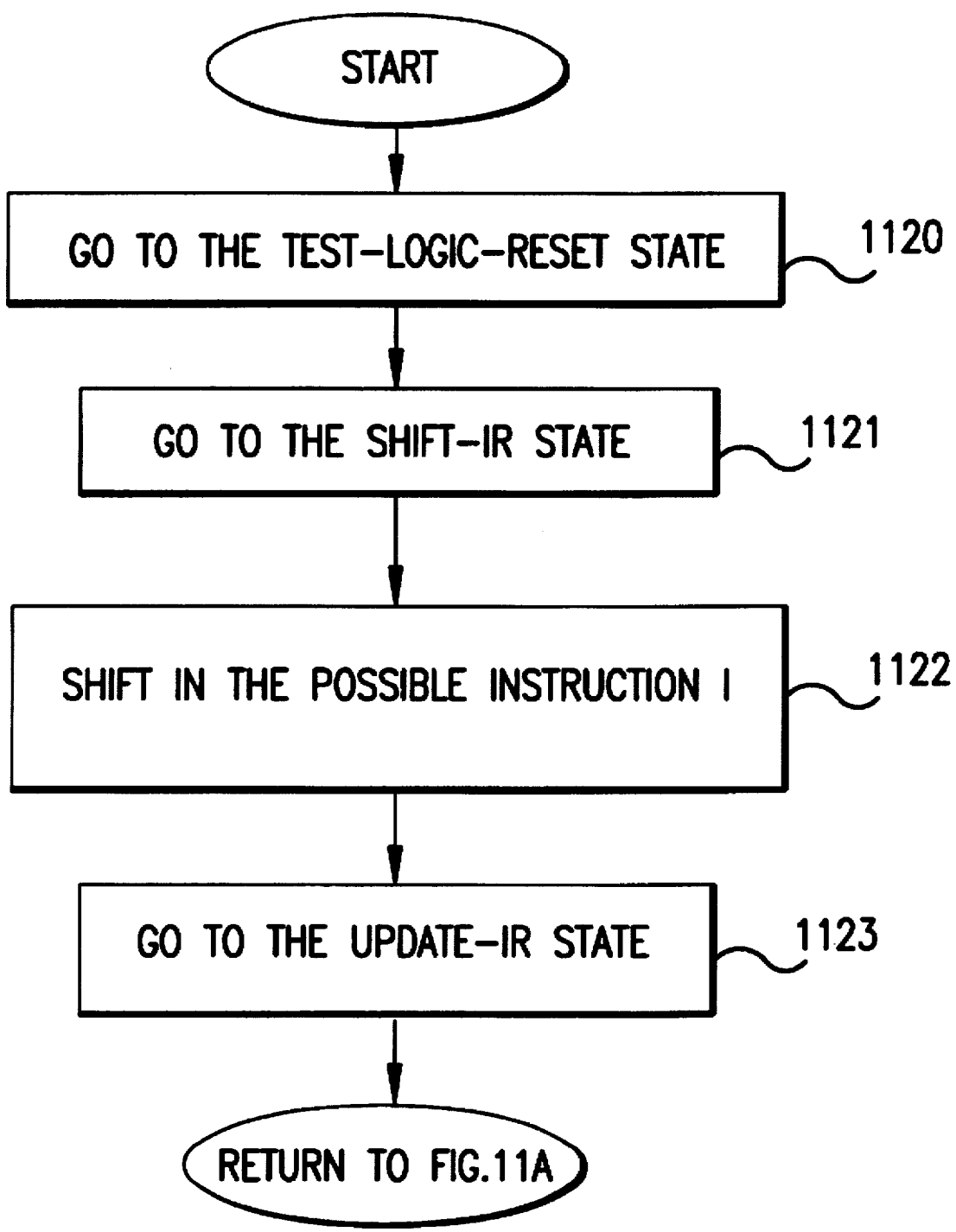
Figure 11C:
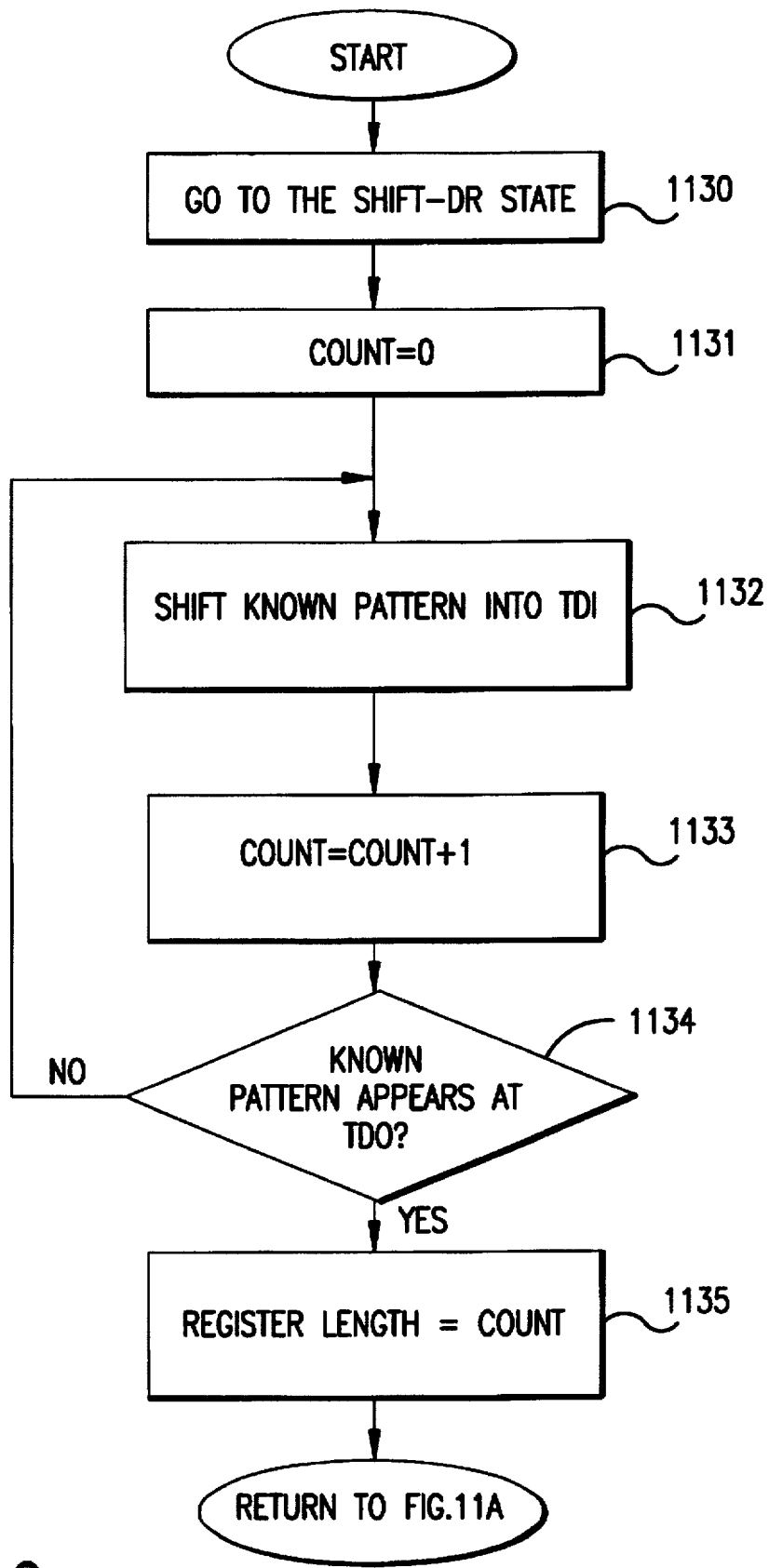
Figure 11D:
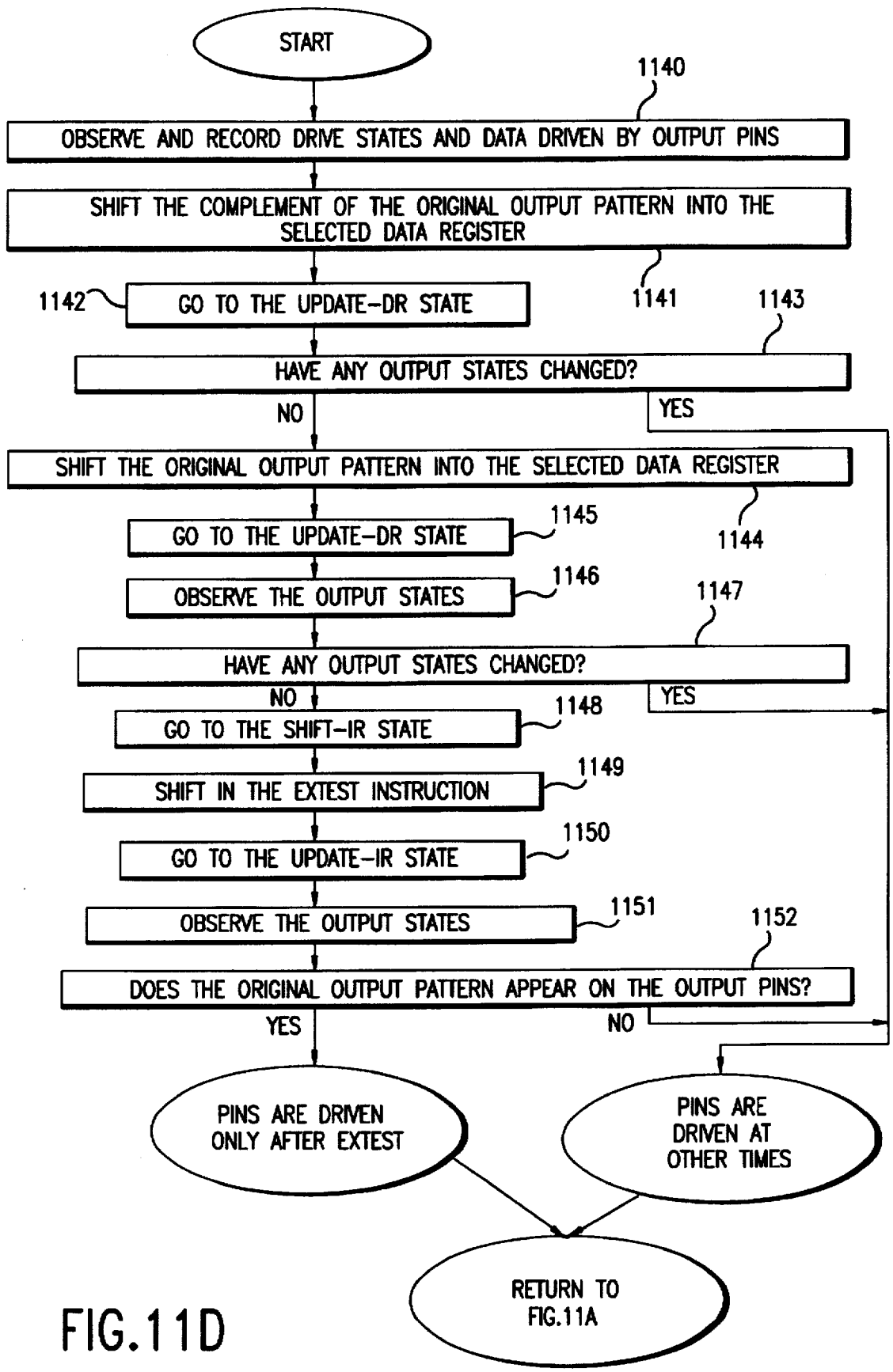
Figure 11E:
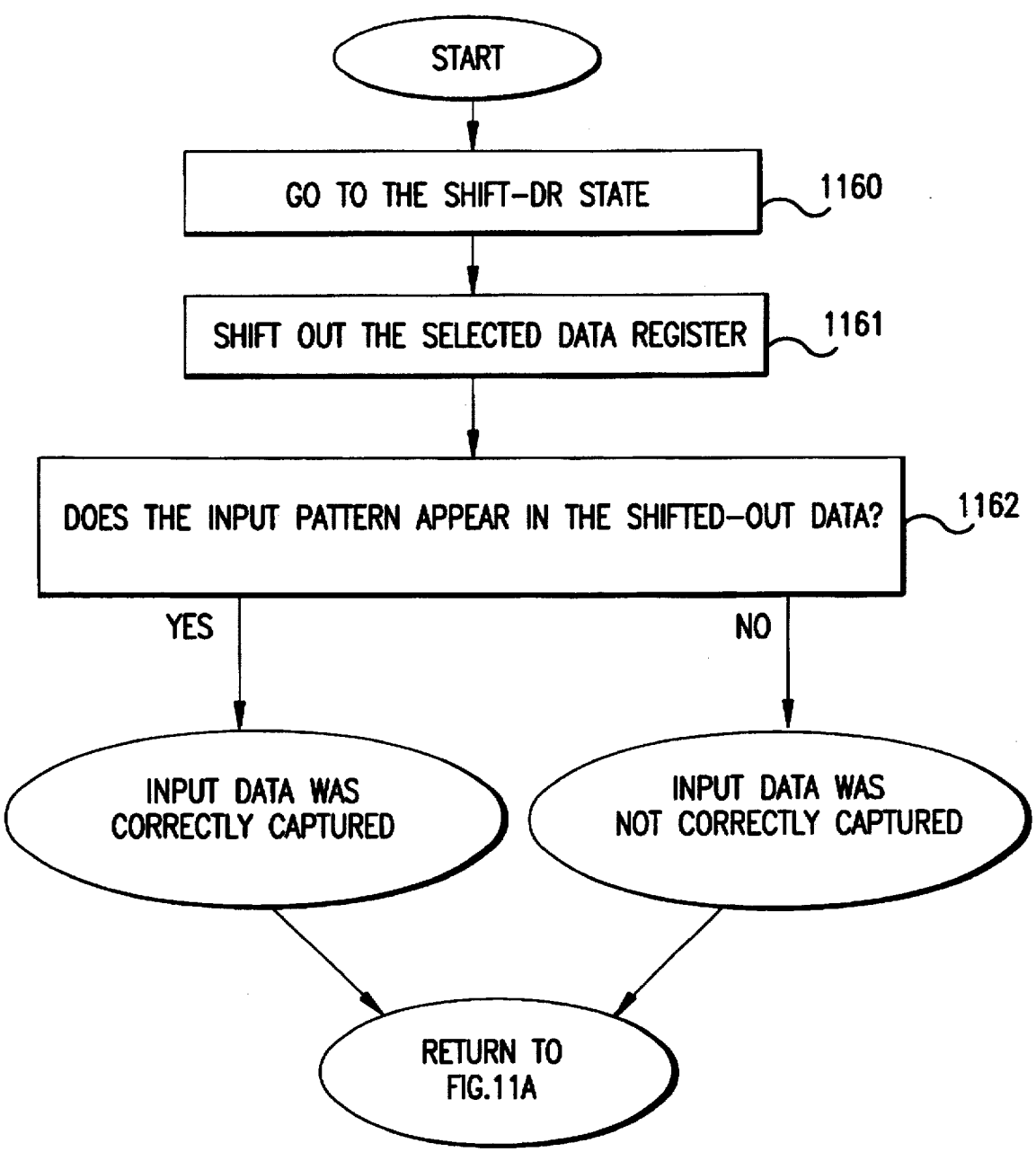

Then, referring to FIG. 10A, the present invention maps the positions within the boundary scan register to the input pins, and automatically determines which of the controlled output pins are tri-state and which are bidirectional input/output pins.

A variation on the idea of counting patterns is used to do this. First, a set of counting patterns is built based on the number of pins rather than on the number of cells. Second, those device pins that have already been identified and confirmed as being something other than scannable inputs are eliminated from the list. Such pins include analog pins, power pins, ground pins, TAP pins and pins already determined to be ordinary outputs. Third, the BS data register is set up in such a way as to disable all controlled outputs. Fourth, the remaining pins on the sample IC externally stimulated, and their states are attempted to be captured in the BS data register. If the states can be captured in cells of the register, the pins are attached to input cells. By capturing the counting patterns, each such cell will in effect speak a number associating it with a particular pin on the sample IC's package.

FIG. 10B depicts an exemplary modified counting pattern for seeking inputs on a hypothetical 24 pin device. Counting patterns have been modified by eliminating pins already known not to be scannable inputs. These are pins 6 (ground), 11–14 (TAP pins), 17 (known output), 18 (power supply), and 19–21 (known outputs). Pseudocode corresponding to the flowchart of FIG. 10A follows.

```
Shift and activate the EXTEST instruction (step 101).
For each modified counting pattern Cp_x (step 102)
    Go to the Shift-DR state (part of step 103).
    Shift into the BS data register a pattern with
        bits to put all the controlled output cells
        in their inactive states and 0's in the other
        positions, and go to the Update-DR state (end
        of step 103).
    Stimulate the external pins of the IC's with the 0
        and 1 bits in counting pattern X (step 104).
    Go to the Capture-DR state to capture the pins (step
        105).
    Go to the Shift-DR state (step 106).
    Shift the BS data register, observing TDO and
        recording the bit for each cell in a bit
        array for that cell at position x in the bit
        array (step 107).
End for each modified counting pattern (step 102).
For each candidate input cell in the BS register (step
    108).
    Assign to each cell the input pin whose number is
        represented in the bit array collected for
        that cell (step 109).
End for each candidate input cell.
```

At completion of the method described above in pseudocode and depicted in FIG. 10A, the present invention checks to see whether all boundary scan cells have been assigned to pins or to control of pins, and further checks to verify that all pins have assigned boundary scan cells. Appropriate error messages are issued for any checks that fail.

Referring now to FIGS. 11A–E, depicted is a method for automatically determining the SAMPLE/PRELOAD instruction in accordance with the present invention. In the search, each value for the instruction register is tried, except for the EXTEST instruction (all 0's), the BYPASS instruction (all 1's), and any other instruction that is already known not to be the SAMPLE/PRELOAD instruction. The SAMPLE/PRELOAD instruction is tested for by the fact that it selects the boundary scan register, and that it invokes both the preload and sample functions. A more detailed explanation of the action of the SAMPLE/PRELOAD instruction can be found in the text of the 1149.1 standard. Returning to FIGS. 11A–E,

```
Choose an output pattern to be shifted into the BS register,
    that will produce known data on the output pins (step
    1101).
Set and hold the inputs to some known input state, for the
    duration of this stage (step 1102).
For each possible instruction (step 1103):
    Input the instruction (step 1104).
    Go to Test-Logic-Reset state (step 1120).
    Go to Shift-IR state (step 1121).
    Shift in the instruction (step 1122).
    Go to Update-IR state (step 1123).
    Check the length of the selected data register (step
        1105).
    Go to Shift-DR state (step 1130).
    Shift a known pattern into the boundary scan register
        through TDI, and count clocks until that pattern
        appears at TDO (steps 1130 to 1135).
    If the length of the data register is not that of the
        BS register (step 1106) then
            The instruction I is not the SAMPLE/PRELOAD
                instruction (step 1112).
            Continue at the beginning of the loop.
    Check that output pins are driven by the selected register
        only after the EXTEST instruction is activated (step
        1107).
        Observe and record the drive states and data driven by
            the output pins (step 1140).
        Shift the compliment of the chosen output pattern into
            the selected data register (step 1141).
        Go to Update-DR state (step 1142).
        Observe states and data driven by the output pins.
        If any of the outputs have changed (step 1143), then
            The instruction I is not the SAMPLE/PRELOAD
                instruction (step 1112).
            Continue at the beginning of the loop.
        Shift the original output pattern into the
            selected data register (step 1144).
        Go to Update-DR state (step 1145).
        Observe states and data drive by the output pins
            (step 1146).
        If any of the outputs have changed (step 1147),
```

-continued

```
    then
        The instruction I is not the SAMPLE/PRELOAD
            instruction (step 1112).
        Continue at the beginning of the loop.
    Go to Shift-IR state (step 1148).
    Shift in the EXTEST instruction (0's) (step 1149).
    Go to Update-IR state (step 1150).
    Observe the output pins (step 1151).
    If the known output pattern does not appear there
            (step 1152), then
        The instruction I is not the SAMPLE/PRELOAD
            instruction (step 1112).
        Continue at the beginning of the loop.
    Check that input pins were captured by the
            selected register (step 1109).
        Go to Shift-DR state (step 1160).
    Shift out the data register (step 1161).
    Check the inputs cells in the data register output
            (step 1162).
    If the known input pattern does not appear there
            (step 1110), then
        The instruction I is not the SAMPLE/PRELOAD
            instruction (step 1112).
        Continue at the beginning of the loop.
    We have a candidate SAMPLE/PRELOAD instruction.
        Record the instruction I as a candidate for the
            SAMPLE/PRELOAD instruction (step 1111).
```

Figure 12:
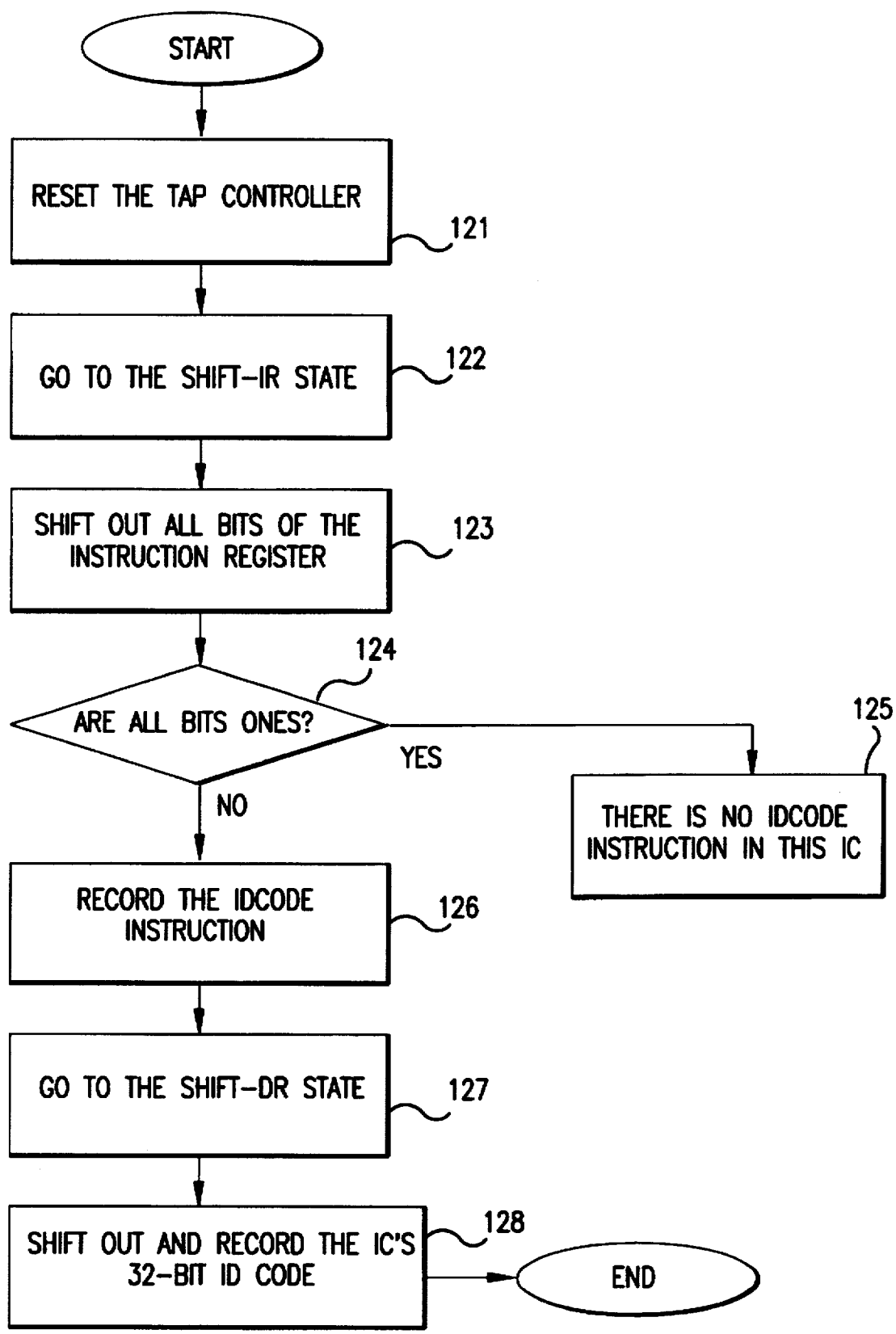

Referring now to FIG. 12, the IDCODE instruction and ID code, are found, if present. Resetting the TAP controller causes the IDCODE instruction, if any, to be loaded into the instruction register. If there is no IDCODE instruction, then the instruction register is instead loaded with all ones—the BYPASS instruction.

```
Reset the TAP controller (step 121).
Go to Shift-IR state (step 122).
Shift the bits out of the instruction register (step 123).
If these bits are all 1's (step 124),
    there is no IDCODE onstruction (step 125).
Else,
    The bits shifted out represent the IDCODE instruction
        (step 126).
If there is an IDCODE instruction (step 124),
    Shift in and activate the IDCODE instruction (step
        127).
    Go to Shift-DR state (step 128).
    Shift out and record the 32-bit ID code (step 129).
```

After completion of the methods shown in detail with reference to FIGS. 5–12, the following information has been automatically learned from the IC under consideration:

1) the length of the instruction register;

2) the length of the boundary scan data register;

3) which pins are outputs and which pins are inputs, and which are I/O or tri-state outputs;

4) the order in which the pins are represented in the boundary-scan data register;

5) the identity of the control cells in the boundary-scan data register that control I/O and tri-state pins, along with which pins each controls and the sign of that control;

6) the identity of the SAMPLE/PRELOAD instruction; and 7) the identity of the IDCODE instruction and ID code, if present.

Once these parameters have been determined, they are expressed as statements in a BSDL file for the IC under consideration, and are stored (for example on data storage media 5, FIG. 3). The BSDL file may then be used in a known manner to create ATE test programs for circuits containing the IC under consideration.

Experience with Use

The present invention has been built and tested. Among the tests performed on the present invention, one was the learning of BSDL for the PENTIUM® IC, a commercially available processor IC with 274 pins. The PENTIUM® is known to incorporate 1149.1 compliant boundary scan features, but BSDL files describing that are currently unavailable. The present invention, in a few minutes, was able to make a correct BSDL file for the boundary scan circuitry in the PENTIUM® IC. The automatically created BSDL file was used to drive the Teradyne VICTORY automatic program generation software, and automatically generated a working program capable of testing a PENTIUM® IC for correct placement and pin connections on a board under test. This has also been done for a number of other IC's as well.

Although the invention has been described with reference to a particular exemplary embodiment, it will be understood by those of ordinary skill in the art that additions, deletions and changes may be made to the disclosed embodiment, without departing from the spirit and scope of the present invention.

What is claimed is:

1. A method of creating a boundary scan description language file for an integrated circuit by automatically determining parameters of boundary scan circuitry of indeterminate configuration incorporated within the integrated circuit, wherein the parameters include a designation for at least one pin of the integrated circuit, comprising the steps of:

(a) generating a plurality of first bit patterns, each first bit pattern being a unique series of bits;

(b) successively shifting each first bit pattern into a boundary scan data register within the boundary scan circuitry;

(c) detecting both a drive state and a logic state at each pin of the integrated circuit after each first bit pattern is shifted into the boundary scan data register in step (b), wherein each pin having both an active drive state and a high logic state is active-high, and wherein each pin having both an active drive state and a low logic state is active-low;

(d) recording both the drive state and the logic state detected at each pin in step (c);

(e) designating each pin having a drive state that is always active as an ordinary output pin;

(f) designating each pin that is sometimes active-low and sometimes inactive, but never active-high, as an open-collector output pin;

(g) designating each pin that is sometimes active-high and sometimes inactive, but never active-low, as an open-emitter output pin;

(h) designating each pin that is sometimes active-low, sometimes active-high, and sometimes inactive as a controlled output pin; and (i) composing at least one statement in the boundary scan description language file using the designation for at least one pin of the integrated circuit.

2. A method as recited in claim 1, wherein the parameters further include a position of a control cell in the boundary scan data register for at least one controlled output pin of the integrated circuit, and further comprising the steps of:
- (j) determining the position of the control cell in the boundary scan data register for at least one controlled output pin; and
- (k) composing at least one statement in the boundary scan description language file using the position of the control cell in the boundary scan data register for at least one controlled output pin.

3. A method as recited in claim 2,
wherein the determining in step (j) comprises the substeps of
- (j1) composing a binary number from the logic states recorded in step (d) for each controlled output pin designated in step (h),
- (j2) shifting a series of 0 bits into the boundary scan data register,
- (j3) detecting both the drive state and the logic state at each controlled output pin after the series of 0 bits is shifted in step (j2), and
- (j4) recording both the drive state and the logic state detected in step (j3).

4. A method as recited in claim 3,
wherein each controlled output pin having a drive state recorded in step (j4) as inactive is controlled by a first control cell having a position in the boundary scan data register represented by the binary number composed in step (j1), and
wherein each controlled output pin having a drive state recorded in step (j4) as active is controlled by a second control cell having a position in the boundary scan data register represented by the complement of the binary number composed in step (j1).

5. A method as recited in claim 4,
wherein each first control cell activates a corresponding controlled output pin when it contains a 1 bit, and
wherein each second control cell activates a corresponding controlled output pin when it contains a 0 bit.

6. A method as recited in claim 5,
wherein the parameters further include a position of a data cell in the boundary scan data register for at least one output pin of the integrated circuit, and further comprising the steps of:
- (l) determining the position of the data cell in the boundary scan data register for at least one output pin; and
- (m) composing at least one statement in the boundary scan description language file using the position of the data cell in the boundary scan data register for at least one output pin.

7. A method as recited in claim 6,
wherein an EXTEST instruction is defined by IEEE Standard 1149.1, and
wherein the determining in step (l) comprises the substeps of
- (l1) activating each controlled output pin,
- (l2) generating a plurality of second bit patterns, each second bit pattern being a unique series of bits,
- (l3) shifting the EXTEST instruction into an instruction register within the boundary scan circuitry,
- (l4) successively shifting each second bit pattern into the boundary scan data register,
- (l5) detecting a logic state at each output pin of the integrated circuit after each second bit pattern is shifted into the boundary scan data register in step (l4),
- (l6) recording the logic state detected at each output pin in step (l5), and
- (l7) composing a binary number from the logic states recorded in step (l6), each binary number representing the position of the data cell in the boundary scan data register for each output pin.

8. A method as recited in claim 1,
wherein the parameters further include a position of an input data cell in the boundary scan data register for at least one input pin of the integrated circuit, and
further comprising the steps of:
- (j) determining the position of the input data cell in the boundary scan data register for at least one input pin; and
- (k) composing at least one statement in the boundary scan description language file using the position of the input data cell for at least one input pin.

9. A method as recited in claim 8,
wherein the determining in step (j) comprises the substeps of
- (j1) generating a plurality of second bit patterns, each second bit pattern being a unique series of bits,
- (j2) successively stimulating the input pins of the integrated circuit with logic states defined by each second bit pattern generated in step (j1),
- (j3) capturing a logic state at each input pin in the boundary scan data register after the input pins are stimulated in step (j2),
- (j4) shifting a resulting pattern of bits out of the boundary scan data register after a logic state is captured at each input pin in step (j3),
- (j5) recording the logic states defined by each resulting pattern of bits after each resulting pattern of bits is shifted in step (j4), and
- (j6) composing a binary number from the logic states recorded in step (j5), each binary number including one bit from the same position in each resulting pattern, each binary number representing the position of the input data cell in the boundary scan data register for each input pin.

10. A method of creating a boundary scan description language file for an integrated circuit by automatically determining parameters of boundary scan circuitry of indeterminate configuration incorporated within the integrated circuit, the parameters including a SAMPLE/PRELOAD instruction for the boundary scan circuitry, the SAMPLE/PRELOAD instruction being defined by IEEE Standard 1149.1, comprising the steps of:
- (a) shifting a first bit pattern into a boundary scan data register within the boundary scan circuitry;
- (b) stimulating a plurality of input pins of the integrated circuit with logic states defined by a second bit pattern;
- (c) generating a plurality of instruction patterns;
- (d) sequentially shifting each instruction pattern into an instruction register within the boundary scan circuitry, thereby selecting one of a plurality of data registers within the boundary scan circuitry;
- (e) measuring a length of the selected data register after each instruction pattern is shifted in step (d);
- (f) detecting a logic state at each output pin of the integrated circuit after each instruction pattern is shifted in step (d);
- (g) recording the logic state detected at each output pin in step (f);
- (h) capturing a logic state at each input pin after each instruction pattern is shifted in step (d), wherein the logic states are captured in the selected data register; and (i) recording the logic state captured at each input pin in step (h).

11. A method as recited in claim 10, further comprising the steps of:

(j) comparing the length of the selected data register with a known length of the boundary scan data register after each instruction pattern is shifted in step (d), to determine whether the length of the selected data register is equal to the known length of the boundary scan data register;

(k) comparing the first bit pattern with the logic states recorded in step (g) after each instruction pattern is shifted in step (d), to determine whether the recorded logic states are equal to the first bit pattern;

(l) comparing the second bit pattern with the logic states recorded in step (i) after each instruction pattern is shifted in step (d), to determine whether the recorded logic states are equal to the second bit pattern;

(m) designating an instruction pattern as the SAMPLE/PRELOAD instruction when the length of the selected data register is equal to the known length of the boundary scan data register, and the logic states recorded in step (g) are equal to the first bit pattern, and the logic states recorded in step (i) are equal to the second bit pattern; and (n) composing at least one statement in a boundary scan description language file for the integrated circuit using the instruction pattern designated as the SAMPLE/PRELOAD instruction in step (m).

* * * * *